(12) United States Patent
Chen et al.

(10) Patent No.: US 12,400,860 B2
(45) Date of Patent: Aug. 26, 2025

(54) SEMICONDUCTOR DEVICE WITH TWO-DIMENSIONAL MATERIALS

(71) Applicant: Taiwan Semiconductor Manufacturing Company, Ltd., Hsinchu (TW)

(72) Inventors: Tse-An Chen, Taoyuan (TW); Lain-Jong Li, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 18/316,096

(22) Filed: May 11, 2023

(65) Prior Publication Data

US 2023/0307234 A1    Sep. 28, 2023

Related U.S. Application Data

(63) Continuation of application No. 17/078,247, filed on Oct. 23, 2020, now Pat. No. 11,688,605.

(Continued)

(51) Int. Cl.
*H10D 30/01* (2025.01)
*H01L 21/02* (2006.01)
(Continued)

(52) U.S. Cl.
CPC ........ *H01L 21/187* (2013.01); *H01L 21/0254* (2013.01); *H01L 21/02568* (2013.01);
(Continued)

(58) Field of Classification Search
None
See application file for complete search history.

(56) References Cited

U.S. PATENT DOCUMENTS

| 9,318,591 B2 | 4/2016 | Geim et al. |
| 11,688,605 B2 * | 6/2023 | Chen ................. H01L 21/0254 438/458 |

(Continued)

FOREIGN PATENT DOCUMENTS

| CN | 103378239 A | 10/2013 |
| CN | 110942980 A | 3/2020 |

(Continued)

OTHER PUBLICATIONS

Chen et al., "Wafer-scale single-crystal hexagonal boron nitride monolayers on Cu(111)", *Nature*, Mar. 4, 2020; 18 pages.

(Continued)

*Primary Examiner* — Benjamin P Sandvik
(74) *Attorney, Agent, or Firm* — Sterne, Kessler, Goldstein & Fox P.L.L.C.

(57) ABSTRACT

The present disclosure describes a method that includes forming a first two-dimensional (2D) layer on a first substrate and attaching a second 2D layer to a carrier film. The method also includes bonding the second 2D layer to the first 2D layer to form a heterostack including the first and second 2D layers. The method further includes separating the first 2D layer of the heterostack from the first substrate and attaching the heterostack to a second substrate. The method further includes removing the carrier film from the second 2D layer.

20 Claims, 23 Drawing Sheets

Related U.S. Application Data

(60) Provisional application No. 63/031,229, filed on May 28, 2020.

(51) Int. Cl.
  *H01L 21/18* (2006.01)
  *H01L 21/683* (2006.01)
  *H01L 21/78* (2006.01)
  *H10D 48/36* (2025.01)
  *H10D 62/80* (2025.01)
  *H10D 62/85* (2025.01)

(52) U.S. Cl.
  CPC ...... *H01L 21/6835* (2013.01); *H01L 21/7813* (2013.01); *H10D 30/015* (2025.01); *H10D 48/362* (2025.01); *H10D 62/80* (2025.01); *H10D 62/8503* (2025.01); *H01L 2221/68368* (2013.01)

(56) References Cited

U.S. PATENT DOCUMENTS

| | | | |
|---|---|---|---|
| 11,968,840 B2* | 4/2024 | Wu | H10D 64/689 |
| 2013/0285115 A1 | 10/2013 | Wei et al. | |
| 2014/0264282 A1 | 9/2014 | Lee et al. | |
| 2015/0303299 A1 | 10/2015 | Chang et al. | |
| 2016/0197148 A1 | 7/2016 | Shepard et al. | |
| 2016/0240719 A1 | 8/2016 | Lin et al. | |
| 2016/0240729 A1 | 8/2016 | Tan et al. | |
| 2017/0098661 A1* | 4/2017 | Rakshit | H10D 62/80 |
| 2017/0194248 A1* | 7/2017 | Das | H01L 23/49827 |
| 2017/0229565 A1 | 8/2017 | Jun et al. | |
| 2019/0214633 A1 | 7/2019 | Arsalan et al. | |
| 2020/0098564 A1 | 3/2020 | Li et al. | |
| 2020/0185532 A1* | 6/2020 | Lin | H01L 21/02568 |
| 2020/0335614 A1* | 10/2020 | Chen | H01L 29/518 |
| 2021/0057424 A1* | 2/2021 | Karda | H01L 29/78696 |
| 2021/0057558 A1 | 2/2021 | Pritchard et al. | |
| 2021/0083122 A1* | 3/2021 | Naylor | H01L 29/78696 |
| 2021/0327758 A1 | 10/2021 | Kim et al. | |
| 2022/0319982 A1* | 10/2022 | Hu | H10D 88/01 |

FOREIGN PATENT DOCUMENTS

| | | |
|---|---|---|
| JP | 2015231682 A | 12/2015 |
| KR | 1020140027958 A | 3/2014 |
| KR | 20140114199 A | 9/2014 |
| KR | 1020170014319 A | 2/2017 |
| TW | 201937790 A | 9/2019 |

OTHER PUBLICATIONS

Wang, S., et al., "All Chemical Vapor Deposition Growth of MoS2:h-BN Vertical van der Waals Heterostructures," ACS Nano, 9(5):5246-5254 (Apr. 2015).

Kim et al. "Synthesis of hexagonal boron nitride heterostructures for 2D van der Waals electronics," Chemical Society Reviews 47.16: 6342-6369, May 30, 2018; 28 pages.

Novoselov et al. "2D materials and van der Waals heterostructures." In: Science, vol. 353, S. 9439-1-9439-11, Jul. 29, 2016; 13 pages.

* cited by examiner

SEMICONDUCTOR DEVICE WITH TWO-DIMENSIONAL MATERIALS

CROSS-REFERENCE TO RELATED APPLICATIONS

The present application is a continuation application of U.S. patent application Ser. No. 17/078,247, titled "Semiconductor Device with Two-Dimensional Materials," filed on Oct. 23, 2020, which claims the benefit of U.S. Provisional Patent Appl. No. 63/031,229, titled "A Method for Forming Semiconductor Devices Having Two-dimensional Materials" and filed on May 28, 2020, all of which are incorporated herein by reference in their entireties.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices. Two dimensional (2D) material layers can be used to form the channel region of semiconductor devices to reduce device footprint and improve device performance.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1:
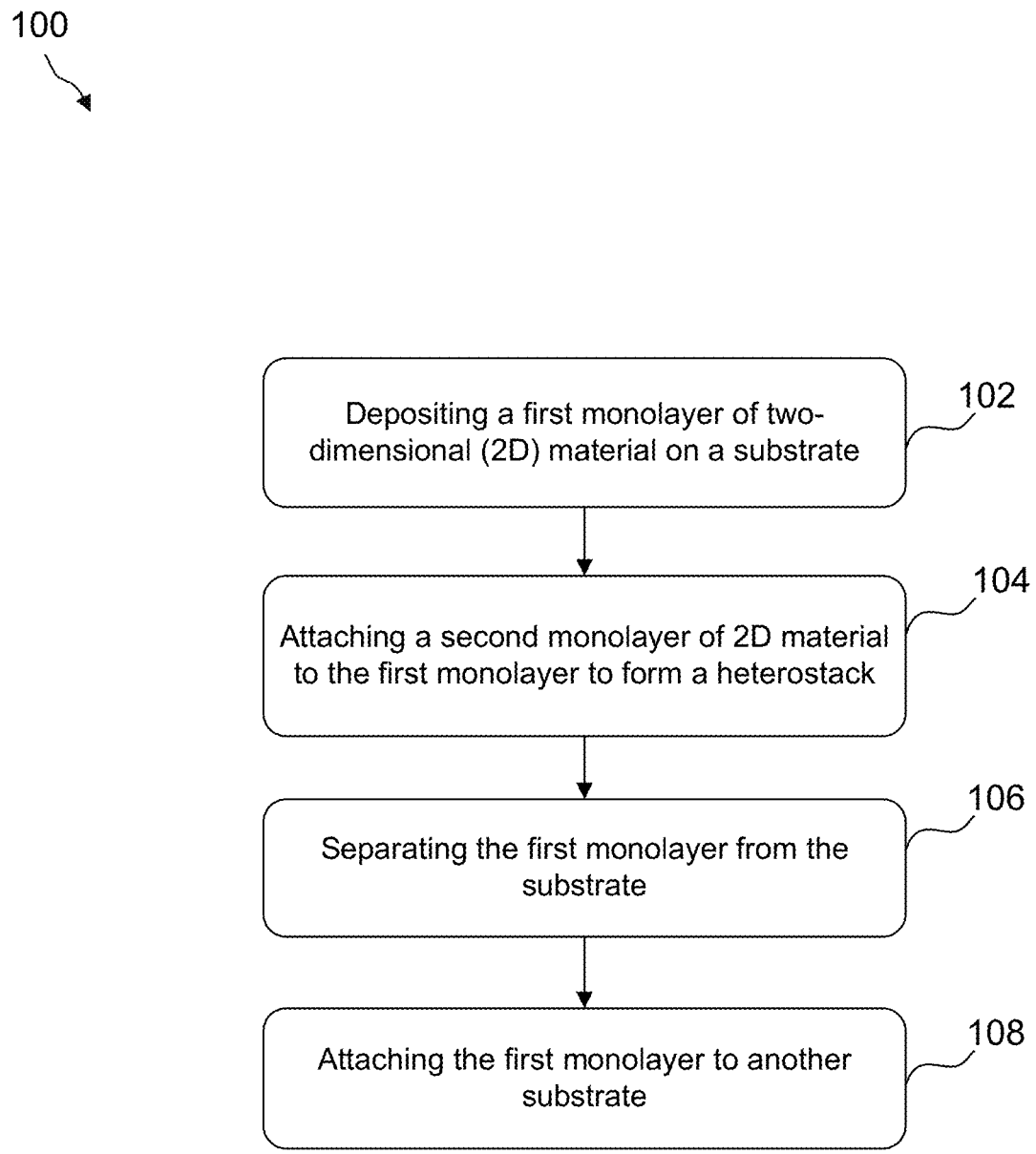
FIG. 1 is a flow diagram of a method for transferring two-dimensional (2D) material layers, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The present disclosure provides methods for forming example complimentary metal-oxide-semiconductor (CMOS) devices. The methods can also be applied towards forming any suitable semiconductor structures, such as gate-all-around (GAA) field effect transistors (FETs), fin-type FET (finFETs), horizontal or vertical GAA finFETs, and planar FETs. An example of a FET is a metal oxide semiconductor field effect transistor (MOSFET). MOSFETs can be, for example, (i) planar structures built in and on the planar surface of a substrate, such as a semiconductor wafer or (ii) built with vertical structures. The term "FinFET" refers to a FET formed over a fin that is vertically oriented with respect to the planar surface of a wafer. The term "vertical," as used herein, means nominally perpendicular to the surface of a substrate.

The performance and scalability of current silicon-based transistors is reaching fundamental limits despite the implementation of various enhancement techniques, such as novel device architectures for enhanced electrostatic control, transport enhancement by strained channels, improved dopant activation, and parasitic resistance reduction. As device dimensions are scaled down to achieve higher packing density, it has been a challenge to shrink silicon-based transistors.

Two-dimensional (2D) materials are monolayers of materials held together by chemical bonds and can be used in a variety of applications to increase performance. For example, 2D materials can be implemented in semiconductor devices, electrodes, water purification devices, and photovoltaic devices. Individual 2D monolayers can be stacked on each other to form a stack of 2D material layers, and the thickness of the stack of 2D material layers can be varied by stacking different numbers of individual monolayers. The stack of 2D materials can be used to form channel regions in semiconductor transistor devices to reduce device footprint and improve device performance. Implementing 2D materials in semiconductor devices can be achieved by a thin film transfer process that can include attaching a monolayer of 2D material to a carrier film, removing the monolayer of 2D material from a host wafer, and placing it on a semiconductor substrate for further fabrication operations. Since the 2D material monolayer has atomic-level thickness, maintaining a high level of cleanliness of the 2D material monolayer is critical for achieving high device performance and yield. However, by-products of various fabrication processes and transfer processes can leave undesirable residue on monolayers of 2D material, especially on larger areas of 2-inch and 3-inch wafers. Applying cleaning processes to remove the interfacial contamination can cause damage to the surface of the 2D material monolayer. For example, adsorbates such as water and hydrocarbons can cover the surfaces of 2D material. Cleaning processes, including dry plasma etching, wet etching, and annealing, can increase surface roughness or etch through the monolayers, while etch by-products can remain on the surface after the cleaning processes. In addition, solvent cleaning processes can also leave residue on the surface of the monolayers.

Various embodiments in the present disclosure describe methods for forming semiconductor devices incorporating substantially residue-free 2D materials (e.g., 2D materials with no residue). Layers of 2D material can be stacked together via van der Waals force and transferred onto a substrate. In some embodiments, interfaces between each monolayer of 2D material can be substantially free of residue (e.g., no residue). In some embodiments, top and bottom surfaces of the layer stack can also be substantially free of residue. In some embodiments, a first monolayer of 2D material is attached to a second monolayer of 2D material via van der Waals force to form a van der Waals heterostack. The stack can be attached to a carrier layer (e.g., a polymer film) and transferred to a substrate for further processing. Additional monolayers of 2D materials can be added to the heterostack by performing additional attaching and wafer-scale transferring processes. Using van der Waals force to form a heterostack of 2D materials can provide the benefit of, among other things, substantially residue-free surfaces and intact layers after transfer. In addition, adhesives are not needed for bonding the layers of 2D material together during the wafer-scale transferring process.

FIG. 1 is a flow diagram of a method 100 for forming a heterostack including 2D materials, according to some embodiments. For illustrative purposes, the operations illustrated in FIG. 1 will be described with reference to the example fabrication process illustrated in FIGS. 2-5. Operations can be performed in a different order or not performed depending on specific applications. It should be noted that method 100 may not produce a complete semiconductor device. Accordingly, it is understood that additional processes can be provided before, during, and after method 100, and that some other processes may only be briefly described herein. The transfer process described in FIGS. 2-5 can be performed in a processing chamber under vacuum without exposing the structures to an ambient environment, which can provide the benefit of preventing surface oxidation and contaminants adsorption that in turn increases the magnitude of van der Waals force at the interfaces. In some embodiments, the vacuum level can be maintained between about $1\times10^{-3}$ Torr and about $1\times10^{-5}$ Torr.

Figure 2:
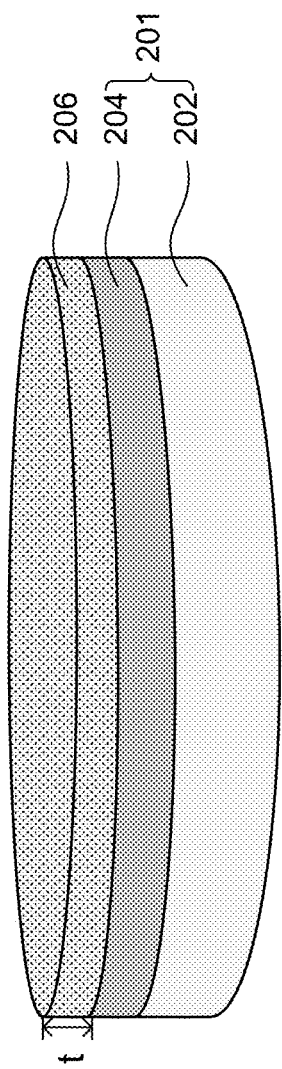
FIGS. 2-5 illustrate various views of layers of 2D materials at various stages of their fabrication process, in accordance with some embodiments.

Referring to FIG. 1, in operation 102, a first monolayer of 2D material is deposited on a substrate, according to some embodiments. As shown in FIG. 2, a first monolayer 206 is deposited on substrate 201. In some embodiments, various structures are collectively referred to as a substrate for simplicity. For example, substrate 201 can include a bulk substrate 202 and a metal layer 204. Bulk substrate 202 can be a carrier wafer and formed using suitable materials, such as an elementary semiconductor, a compound semiconductor, an alloy semiconductor, and any suitable materials. For example, bulk substrate 202 can be formed using silicon, silicon oxide, sapphire, silicon nitride, titanium nitride, silicon germanium, any suitable material, and combinations thereof. Metal layer 204 can be formed using a suitable metal material, such as copper. In some embodiments, nickel, gold, copper, ruthenium, tungsten, silver, cobalt, any suitable metal, and combinations thereof can be used to form metal layer 204. Because the deposition process can be performed in a deposition chamber maintained under vacuum without exposing the substrate or deposited film to ambient, a top surface of first monolayer 206 can be substantially residue free after the deposition process.

First monolayer 206 of a 2D material can be deposited on metal layer 204. In some embodiments, first monolayer 206 can be deposited directly on bulk substrate 202. In some embodiments, first monolayer 206 can be formed using a suitable 2D material, such as a hexagonal boron nitride (h-BN) material. First monolayer 206 can be deposited using suitable deposition methods, such as (i) atomic layer deposition (ALD); (ii) chemical vapor deposition (CVD), such as low pressure CVD (LPCVD), atomic layer CVD (ALCVD), ultrahigh vacuum CVD (UHVCVD), reduced pressure CVD (RPCVD), and any other suitable CVD; (iii) molecular beam epitaxy (MBE) processes; (iv) any suitable epitaxial process; and (v) a combination thereof. A thickness t of first monolayer 206 can be the thickness of a monolayer of 2D material. For example, first monolayer 206 formed using h-BN material can have a thickness t of about 0.33 nm. In some embodiments, thickness t can be between about 0.30 nm and about 0.36 nm. In some embodiments, thickness t can be between about 0.2 nm and about 0.8 nm.

Figure 3A:
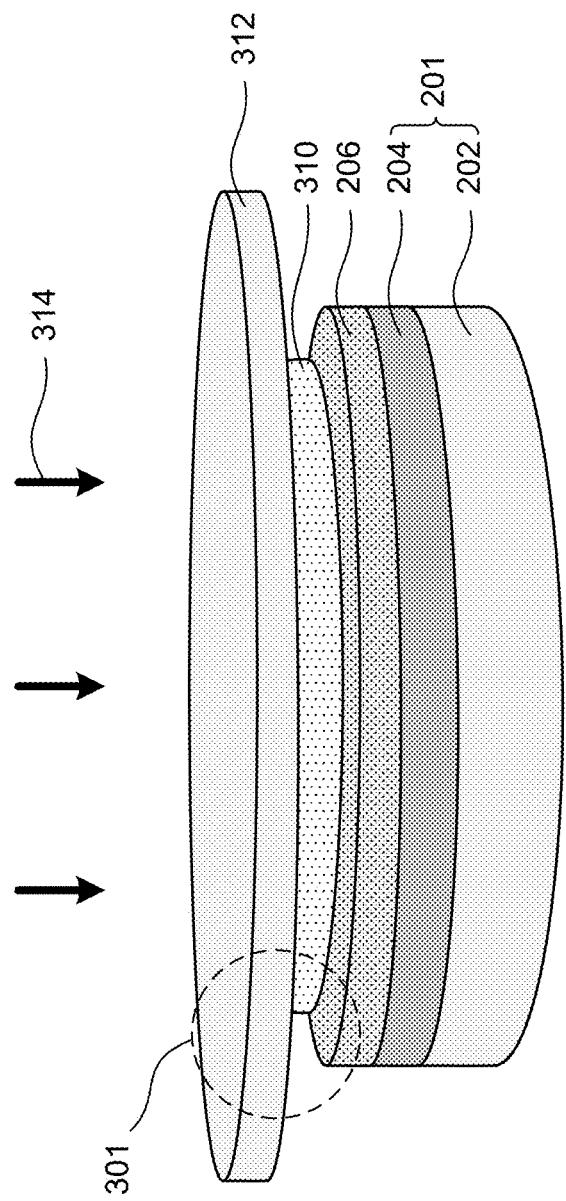

Referring to FIG. 1, in operation 104, a second monolayer of 2D material is attached to the first monolayer of 2D material, according to some embodiments. As shown in FIG. 3A, a second monolayer 310 is attached to first monolayer 206. In some embodiments, a carrier film can be attached to second monolayer 310 prior to the attachment process. For example, carrier film 312 can be attached to a top surface of second monolayer 310. In some embodiments, carrier film 312 can be a polymer layer and adhered to second monolayer 310. In some embodiments, carrier film 312 can be formed using polymethyl methacrylate (PMMA), polyvinyl alcohol (PVA), polypropylene carbonate (PPC), polystyrene (PS), any suitable polymer material, and combinations thereof. In some embodiments, carrier film 312 can be attached to second monolayer 310 by depositing a polymer material on second monolayer 310 and removing the second monolayer 310 from a carrier substrate.

In some embodiments, second monolayer 310 can be formed using transition metal dichalcogenides (TMDs). Suitable TMDs can be denoted as $MX_2$, where M denotes a transition metal element and X denotes a chalcogen element. For example, the transition metal element can be molybdenum or tungsten. In some embodiments, the chalcogen element can be one of sulfur, selenium, or tellurium. In some embodiments, other suitable TMD materials can be used. Thickness of second monolayer 310 can be the thickness of a monolayer of the 2D material. For example, thickness of second monolayer 310 formed using molybdenum disulfide can have a thickness of about 0.65 nm. In some embodiments, thickness of second monolayer 310 can be between about 0.45 nm and about 1.2 nm.

First and second monolayers 206 and 310 can be attached to each other through van der Waals force. The attaching process can be performed in a vacuum environment (e.g., a vacuum chamber) to avoid impurity or moisture contamination at the interface that may degrade the van der Waals force. An optional external force 314 can be applied to a top surface of carrier film 312 after first and second monolayers 206 and 310 have come into physical contact to ensure that the contact is uniform throughout the entire interface between the two monolayers. In some embodiments, the external force can result in a pressure of about 60 $N/in^2$ and about 1600 $N/in^2$ at the interfaces between surfaces. Pressure greater than 1600 $N/in^2$ may cause physical damage to the films while pressure less than about 60 $N/in^2$ may be insufficient for increasing the van der Waals bond strength. The attaching process can be performed in a vacuum environment, such as a processing chamber maintained under vacuum. In some embodiments, the vacuum level can be maintained between about $1\times10^{-3}$ Torr and about $1\times10^{-5}$ Torr to increase the magnitude of van der Waals force at the interface. The interface between first and second monolayers 206 and 310 can be substantially residue free because carrier film 312 or other structures are not in contact with first monolayer 206.

Although first monolayer 206 and carrier film 312 illustrated in FIG. 3A are not in physical contact with each other, the edges of first monolayer 206 and carrier film 312 can be sealed together to protect second monolayer 310 during the transfer process and prevent exposure to contamination. In addition, sealing the edges can also enhance the structural integrity of the stacked layers (formed of carrier film and monolayers) during the transfer process. To seal the film edges prior to the wafer-scale transferring process, surface areas of first monolayer 206 and carrier film 312 can both be greater than a surface area of second monolayer 310. For example, first monolayer 206 can be have a circular area with a diameter about 2 inches, and second monolayer 310 can have a circular area with a diameter less than 2 inches, such as between about 1.7 inches and about 1.9 inches. Carrier film 312 can have a diameter that is between about 2.1 inches and about 2.5 inches.

Figure 3B:
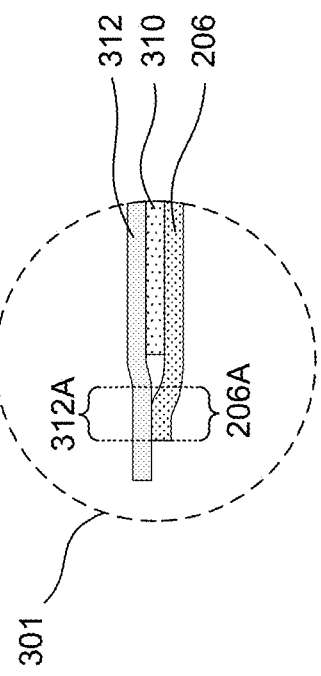

Due to the surface area difference, portions of first monolayer 206 and carrier film 312 that are not in contact with second monolayer 310 can also overlap with each other. For example, as shown in FIG. 3B which illustrates enlarged view 301 of the edge regions of the stacked layers, perimeter portions 312A of carrier film 312 and perimeter portions 206A of first monolayer 206 can be deformed under the application of force 314 and be in physical contact with each other, sealing second monolayer 310 after the physical contact. In some embodiments, physically contacting first monolayer 206 and carrier film 312 can lead to the formation of chemical bonds or other attaching mechanisms at the interface of the aforementioned films, therefore increasing the structural integrity of the stacked layers. The width of overlapping perimeter portions 312A and 206A can be greater than about 0.5 mm to ensure a secure seal that can maintain its structural integrity during the transfer process.

Figure 4:
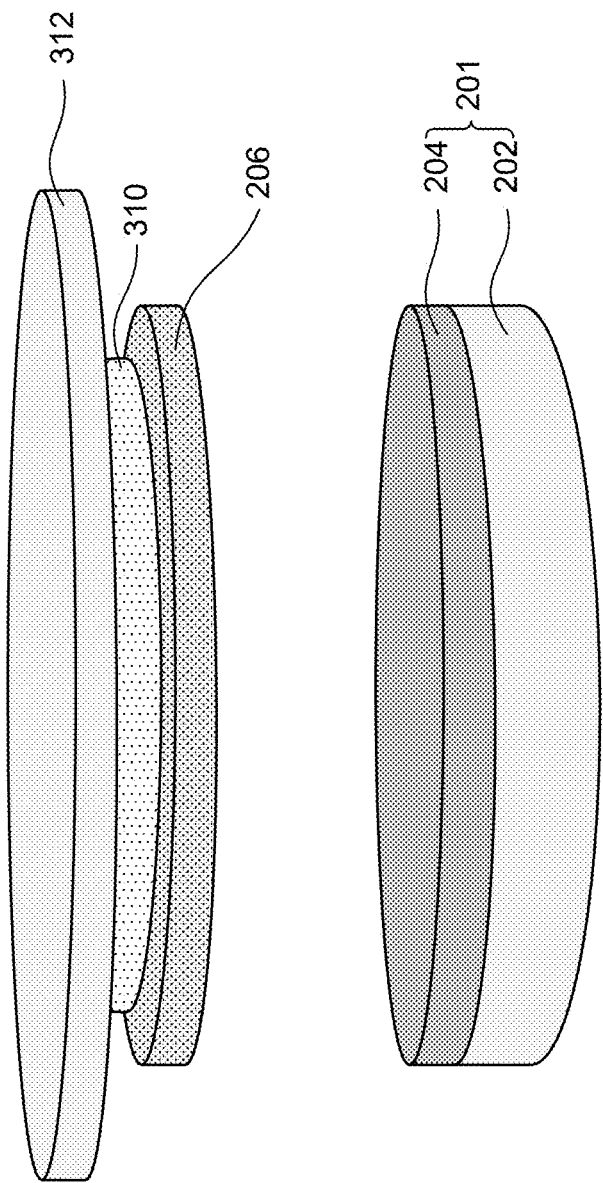

Referring to FIG. 1, in operation 106, the first monolayer is separated from the substrate, according to some embodiments. As shown in FIG. 4, heterostack formed of first monolayer 206 and second monolayer 310 are separated from substrate 201 at the interface of first monolayer 206 and metal layer 204. To achieve separation only at the interface of first monolayer 206 and metal layer 204 while keeping the heterostack intact, an electrochemical delamination process can be used. The stack of layers including substrate 201 can be submerged into an aqueous solution of sodium hydroxide (NaOH). A DC voltage can be applied to the layer stack by using metal layer 204 as a cathode and a platinum (Pt) foil that is formed on top of carrier film 312 as the anode. In some embodiments, the applied DC voltage can be between about 3 V and about 5 V. For example, the applied DC voltage can be about 4 V. During the electrochemical delamination process, first monolayer 206 can be detached from metal layer 204 by the generation of hydrogen gas formed at the interface of first monolayer 206 and metal layer 204. First monolayer 206 and second monolayer 310 can be held together by van der Waals force during the electrochemical delamination process and subsequently transferred to other suitable substrates. In some embodiments, other suitable separation process can be used.

Figure 5:
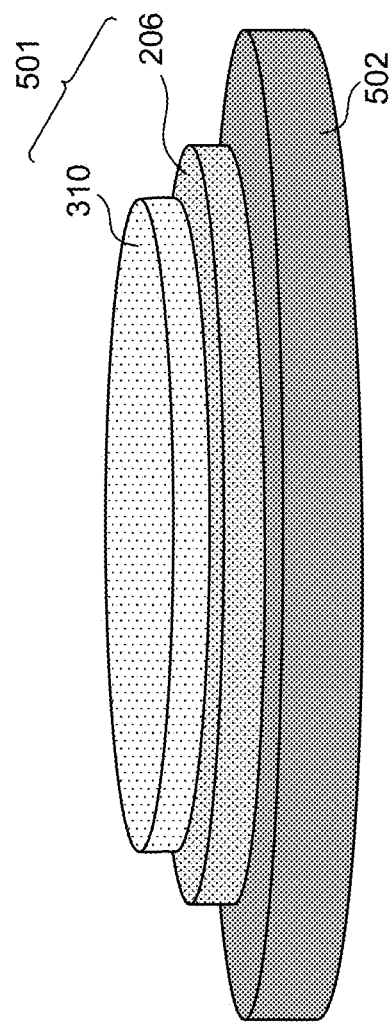
Figure 5:
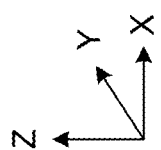

Referring to FIG. 1, in operation 108, the first monolayer is attached to another substrate, according to some embodiments. As shown in FIG. 5, a heterostack 501 formed of first and second monolayers 206 and 310 can be attached to another substrate 502 for use in additional fabrication processes. In some embodiments, substrate 502 can be a 4-inch wafer formed using silicon or silicon oxide. In some embodiments, substrate 502 can be a wafer having any suitable diameter. For example, substrate 502 can be a wafer having a diameter between about 2 inches and about 12 inches. In some embodiments, a bottom surface of first monolayer 206 can be attached to a top surface of substrate 502 via suitable attachment mechanisms, such as van der Waals bonding, chemical bonding, adhesives, any suitable bonding methods, and combinations thereof. In some embodiments, carrier film 312 can be removed using suitable methods, such as dry etching processes, wet etching processes, ashing processes, any suitable removal processes, and combinations thereof. In some embodiments, residue may remain on a top surface of second monolayer 310 as a result of the carrier film removal process and/or subsequent processes, but the interface between first and second monolayers 206 and 310 can be protected without being exposed and remain substantially residue free.

Figure 6:
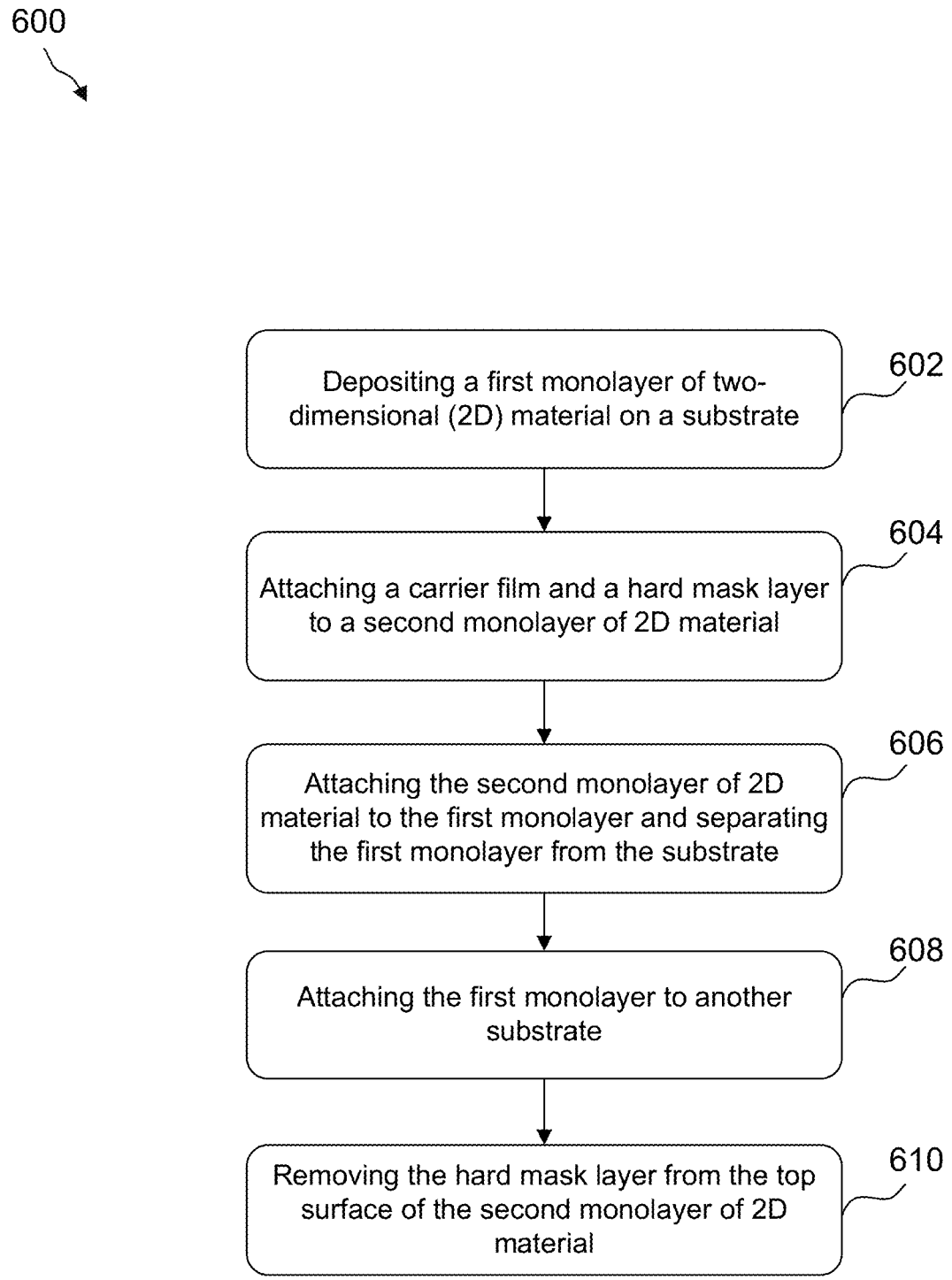
FIG. 6 is a flow diagram of a method for transferring 2D material layers, in accordance with some embodiments.

FIG. 6 is a flow diagram of a method 600 for forming a heterostack including 2D materials, according to some embodiments. For illustrative purposes, the operations illustrated in FIG. 6 will be described with reference to the example fabrication process as illustrated in FIGS. 7-10. Operations can be performed in a different order or not performed depending on specific applications. It should be noted that method 600 may not produce a complete semiconductor device. Accordingly, it is understood that additional processes can be provided before, during, and after method 600, and that some other processes may only be briefly described herein. Similar elements in FIGS. 7-10 and FIGS. 2-5 are labelled with the same annotations for simplicity. The transfer process described in FIGS. 7-10 can be performed in a processing chamber under vacuum without exposing the structures to an ambient environment, which can provide the benefit of preventing surface oxidation and contaminants adsorption that in turn increases the magnitude of van der Waals force at the interface. In some embodiments, the vacuum can be maintained between about $1\times10^{-3}$ Torr and about $1\times10^{-5}$ Torr.

Figure 7:
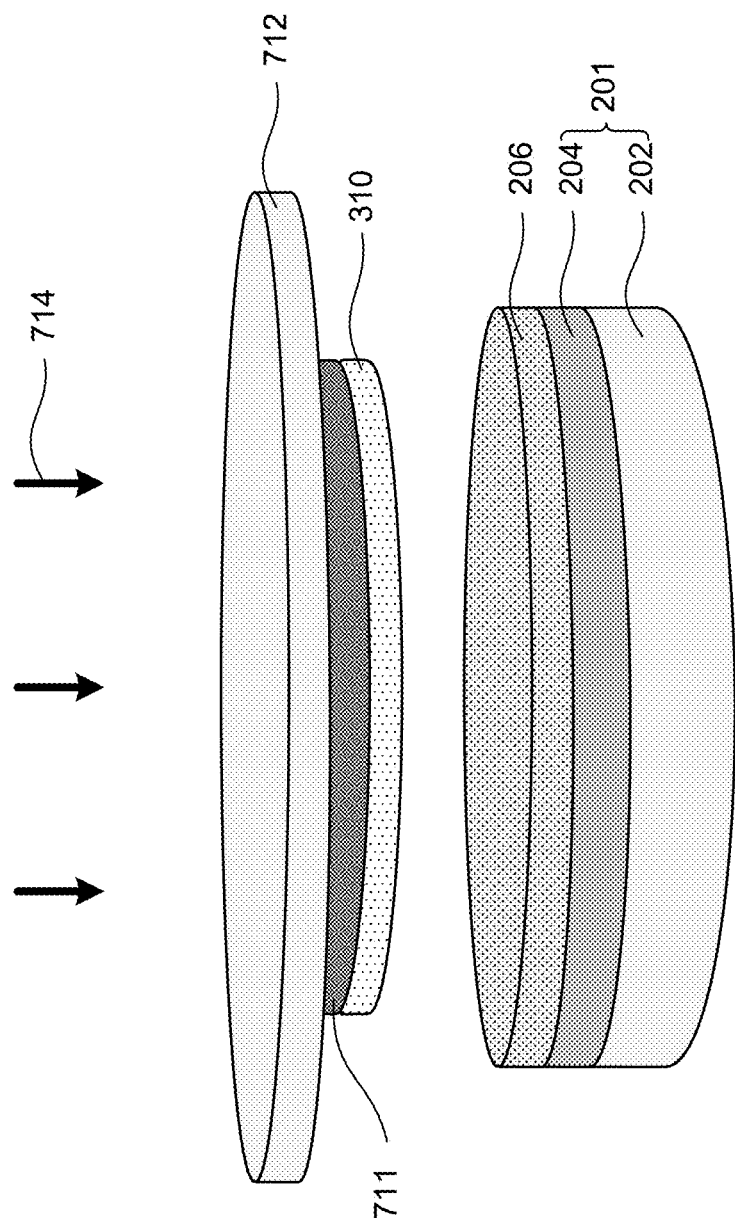
FIGS. 7-10 illustrate various views of layers of 2D materials at various stages of their fabrication process, in accordance with some embodiments.

Referring to FIG. 6, in operation 602, a first monolayer of 2D material is deposited on a substrate, according to some embodiments. As shown in FIG. 7, first monolayer 206 can be deposited on substrate 201. In some embodiments, first monolayer 206 can be deposited on metal layer 204. Similar to first monolayer 206 described in FIG. 2, first monolayer 206 described in FIG. 7 can be formed using an h-BN material. In some embodiments, first monolayer 206 can be deposited directly on bulk substrate 202. First monolayer 206 can be deposited using any suitable deposition methods, such as ALD and CVD.

Referring to FIG. 6, in operation 604, a carrier film and a hard mask layer are attached to a second monolayer of 2D material, according to some embodiments. As shown in FIG. 7, a bottom surface of hard mask 711 can be attached to a top surface of second monolayer 310. Additionally, a carrier film 712 can be attached to a top surface of hard mask 711. In some embodiments, second monolayer 310 described in FIG. 7 and second monolayer 310 can be formed using similar materials. For example, second monolayer 310 can be formed using TMDs. Suitable TMDs can be denoted as $MX_2$, where M denotes a transition metal element and X denotes a chalcogen element. Since second monolayer 310 is formed of a 2D material having atomic level thickness, hard mask 711 can provide additional mechanical support for second monolayer 310 to increase its structural integrity during fabrication processes and also protect it from chemical reactions during the formation and removal of carrier film 712. In some embodiments, hard mask 711 can be formed of aluminum oxide, silicon nitride, silicon oxide, any suitable dielectric material, and combinations thereof. In some embodiments, hard mask 711 can be deposited using ALD, CVD, PVD, any suitable deposition methods, and combinations thereof. In some embodiments, carrier film 712 can be similar to carrier film 312 described in FIG. 3 and is not described in detail herein for simplicity. In some embodiments, surface areas of carrier film 712 and first monolayer 206 can be greater than surfaces areas of second monolayer 310 and hard mask 711. External force 714 can be applied to the top surface of carrier film to increase the bonding uniformity and the strength of the van der Waals bond. Force 714 can be similar to force 314 described in FIG. 3A and is not described in detail herein for simplicity.

Figure 8:
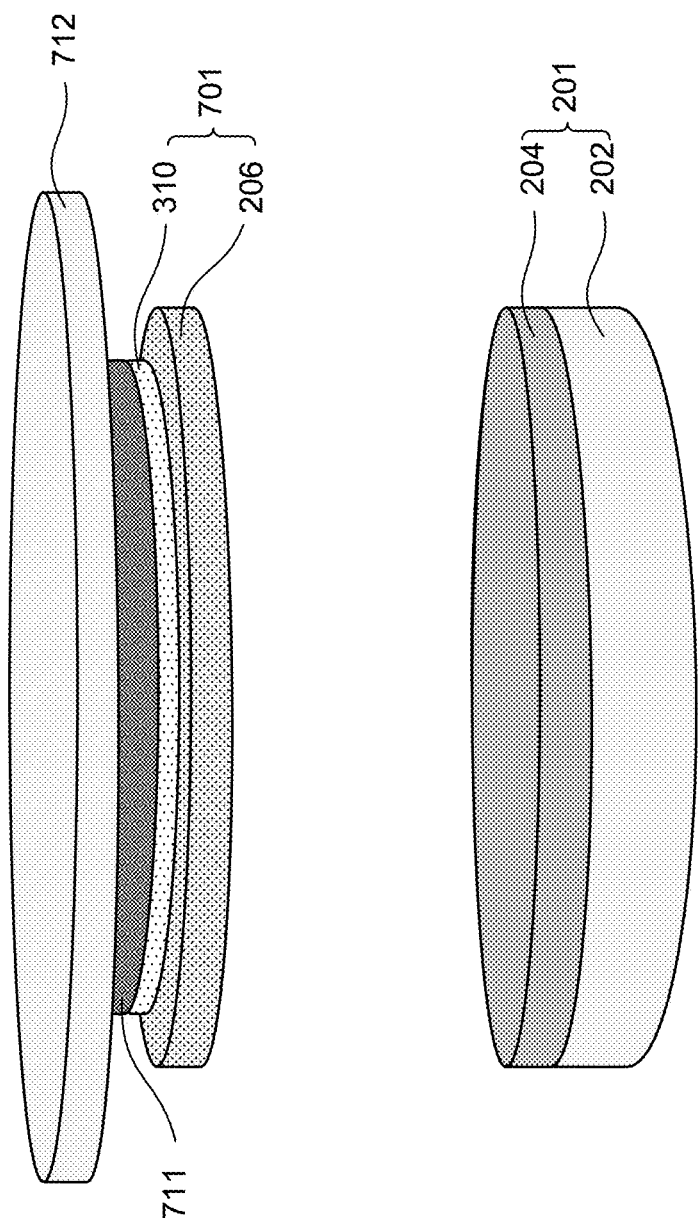

Referring to FIG. 6, in operation 606, the second monolayer of 2D material is attached to the first monolayer of 2D material and the first monolayer is separated from the substrate, according to some embodiments. As shown in FIG. 8, a bottom surface of second monolayer 310 is attached to a top surface of first monolayer 206. In some embodiments, the aforementioned surfaces are attached via van der Waals bonding, forming a heterostack 701 that includes a pair of 2D material films of first and second monolayers 206 and 310, respectively. First monolayer 206 can be separated from substrate 201 by performing a electrochemical delamination process similar to the separation process described in FIG. 4. In addition, similar to the sealing process described in FIG. 3B, the perimeter regions of carrier film 712 and first monolayer 206 can be pressed and sealed together to protect second monolayer 310 that is enclosed in between.

Figure 9:
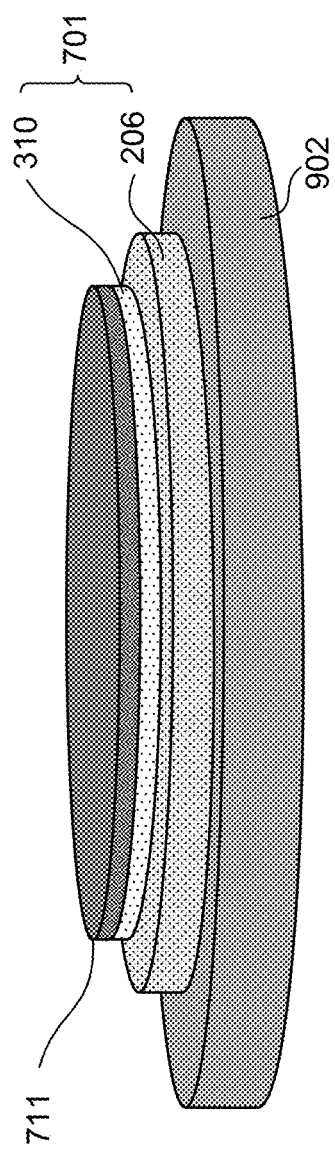

Referring to FIG. 6, in operation 608, the first monolayer of 2D material is attached to another substrate, according to some embodiments. As shown in FIG. 9, bottom surface of first monolayer 206 is attached to a substrate 902 such that heterostack 701 can be prepared for additional fabrication processes. In some embodiments, substrate 902 can be a substrate, a semiconductor device, or any suitable semiconductor structure. In some embodiments, substrate 902 can be a 4-inch wafer formed using silicon or silicon oxide. In some embodiments, after attaching first monolayer 206 to substrate 902, carrier film 712 can be removed using a removal process. For example, a polymer remover or a wet chemical etch can be used to remove carrier film 712 and exposing underlying hard mask 711. Residue may remain on the top surface of hard mask 711, but the top surface of second monolayer 310 can be protected by hard mask 711 during the removal process of carrier film 712 and remain substantially free of residue.

Figure 10:
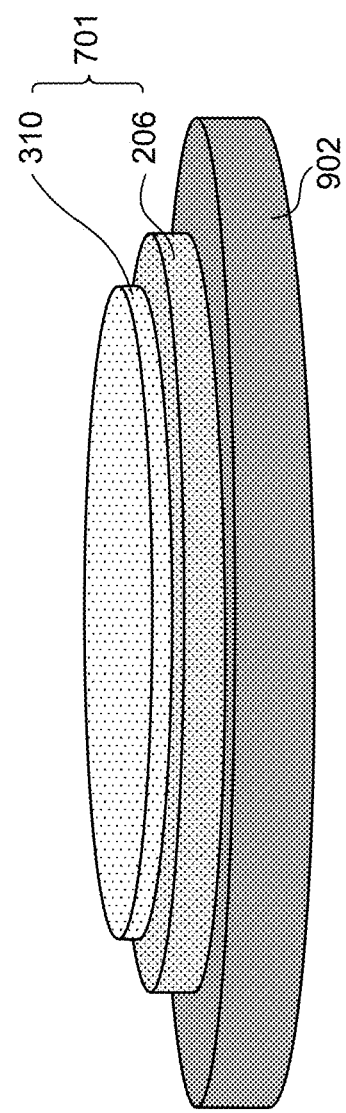

Referring to FIG. 6, in operation 610, the hard mask layer is removed from the top surface of the second monolayer of 2D material, according to some embodiments. As shown in FIG. 10, hard mask 711 can be removed to expose the underlying second monolayer 310. Hard mask 711 can be removed using dry plasma etching, wet chemical etching, any suitable etching processes, and combinations thereof. The top surface of second monolayer 310 can be substantially free of residue after the removal process of hard mask 711 because second monolayer 310 can be inert to the etching processes used to remove hard mask 711. For example, compared to organic polymer carrier films, hard mask 711 can leave less residue on second monolayer 310 after being removed.

Figure 11:
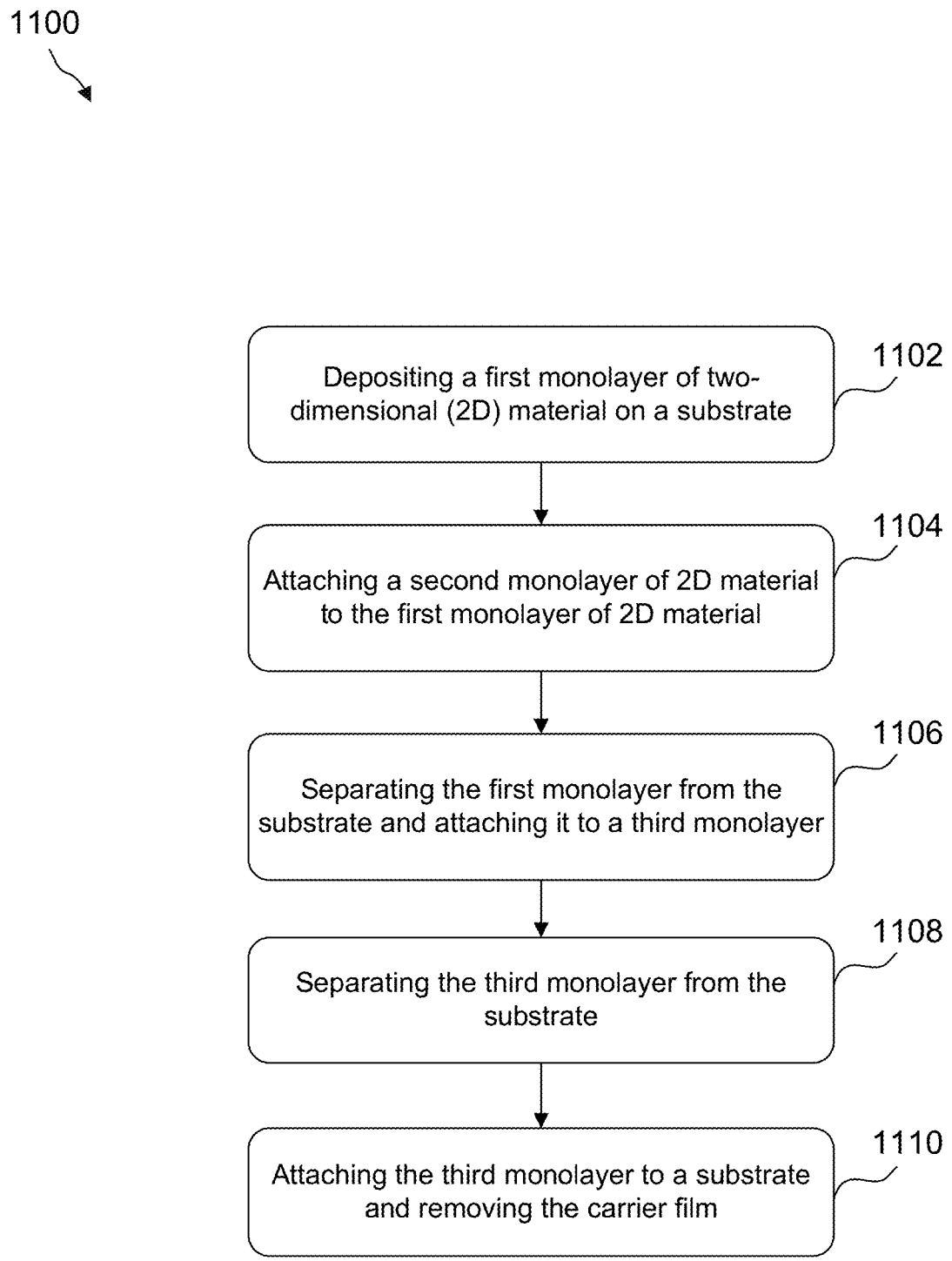
FIG. 11 is a flow diagram of a method for transferring 2D material layers, in accordance with some embodiments.

FIG. 11 is a flow diagram of a method 1100 for forming a heterostack including 2D materials, according to some embodiments. For illustrative purposes, the operations illustrated in FIG. 11 will be described with reference to the example fabrication process as illustrated in FIGS. 12-15. Operations can be performed in a different order or not performed depending on specific applications. It should be noted that method 1100 may not produce a complete semiconductor device. Accordingly, it is understood that additional processes can be provided before, during, and after method 1100, and that some other processes may only be briefly described herein. Similar elements in FIGS. 12-15 and FIGS. 2-5 are labelled with the same annotations for simplicity. The transfer process described in FIGS. 12-15 can be performed in a processing chamber under vacuum without exposing the structures to an ambient environment, which can provide the benefit of preventing surface oxidation and contaminants adsorption that in turn increases the magnitude of van der Waals force at the interface. In some embodiments, the vacuum can be maintained between about $1\times10^{-3}$ Torr and about $1\times10^{-5}$ Torr.

Figure 12:
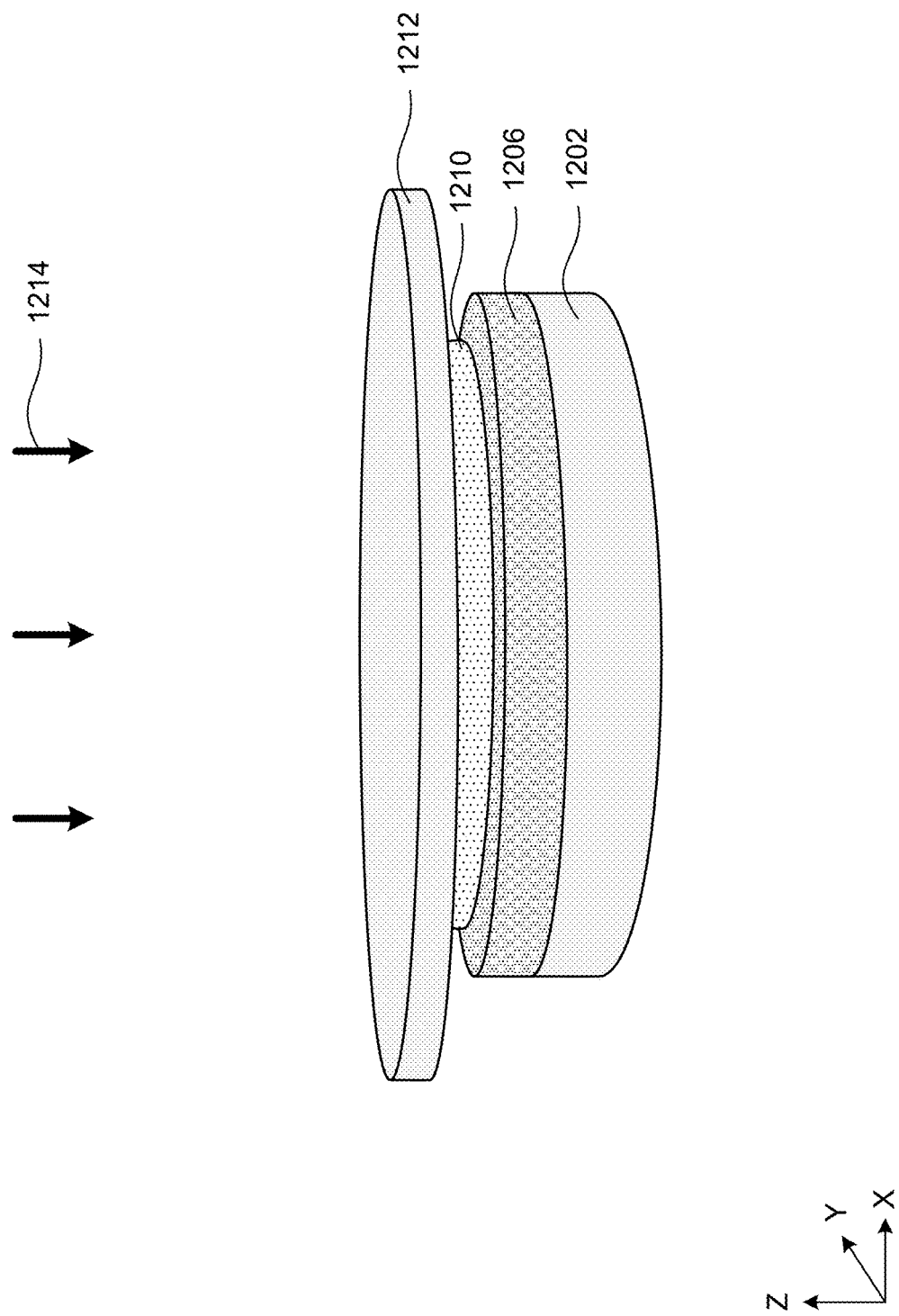
FIGS. 12-15 illustrate various views of layers of 2D materials at various stages of their fabrication process, in accordance with some embodiments.

Referring to FIG. 11, in operation 1102, a first monolayer of 2D material can be deposited on a substrate, according to some embodiments. As shown in FIG. 12, first monolayer 1206 can be deposited on substrate 1202. In some embodiments, first monolayer 1206 can be formed using TMDs. Suitable TMDs can be denoted as $MX_2$, where M denotes a transition metal element and X denotes a chalcogen element. For example, the transition metal element can be molybdenum or tungsten. In some embodiments, the chalcogen element can be one of sulfur, selenium, or tellurium. In some embodiments, other suitable TMD materials can be used.

First monolayer 1206 can be deposited using ALD, LPCVD, ALCVD, UHVCVD, RPCVD, MBE, any suitable epitaxial process, and combinations thereof. In some embodiments, substrate 1202 can be similar to substrate 202 described in FIG. 2 and is not described in detail here for simplicity.

Referring to FIG. 11, in operation 1104, a second monolayer of 2D material is attached to the first monolayer of 2D material, according to some embodiments. A bottom surface of a second monolayer 1210 can be attached to a top surface of first monolayer 1206. First and second monolayers 1206 and 1210 can be attached together by van der Waals bonding to form a heterostack. Additionally, a carrier film 1212 can be attached to a top surface of second monolayer 1210. In some embodiments, second monolayer 1210 can be formed using a 2D material, such as h-BN. In some embodiments, second monolayer 1210 can be formed using any suitable 2D material, such as TMD materials. In some embodiments, first and second monolayers 1206 and 1210 can be formed using different 2D materials. For example, first monolayer 1206 can be formed using molybdenum disulfide, and second monolayer 1210 can be formed using h-BN. First and second monolayers 1206 and 1210 can be attached using van der Waals bonding. In some embodiments, a carrier film 1212 can be attached to a top surface of second monolayer 1210. Carrier film 1212 can be a polymer layer formed using PMMA, PVA, PPC, PS, any suitable polymer material, and combinations thereof. In some embodiments, carrier film 1212 can be similar to carrier film 312 described in FIGS. 3A and 3B and is not described in detail herein for simplicity. In some embodiments, an external force 1214 can be used to increase the bonding uniformity and strength. External force 1214 can be similar to force 314 and is not described in detail herein for simplicity.

Figure 13:
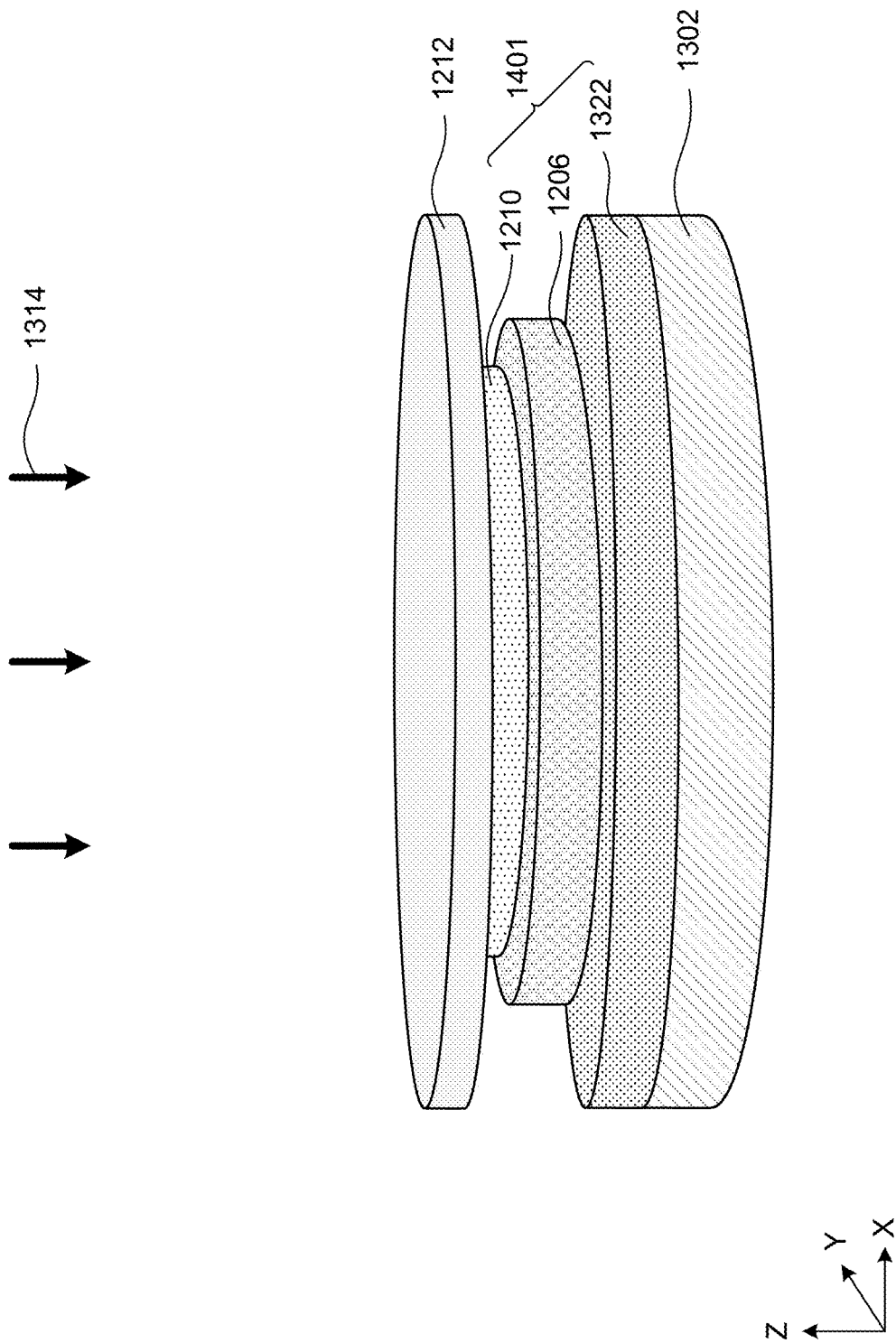

Referring to FIG. 11, in operation 1106, the first monolayer can be separated from the substrate and attached to a third monolayer, according to some embodiments. As shown in FIG. 13, first monolayer layer 1206 can be separated from substrate 1202. In some embodiments, first monolayer 1206 can be removed from substrate 1202 using a detaching process, such as a thermal release process, a laser release process, an ultra-violet (UV) treatment process, a chemical strip process, any suitable removal process, and/or combinations thereof. In some embodiments, perimeter regions of carrier film 1212 and first monolayer 1206 can be bonded together, and the bonding strength can be sufficient to support mechanically detaching first monolayer 1206 from substrate 1202. In some embodiments, first monolayer 1206 can be formed on a metal layer of substrate 1202, and an electrochemical delamination process can be used for the detaching process.

First monolayer 1206 can be attached to third monolayer 1322 formed of 2D materials. In some embodiments, third monolayer 1322 can be formed using h-BN. In some embodiments, third monolayer 1322 can be formed using a suitable 2D material, such as a TMD layer. In some embodiments, first and third monolayers 1206 and 1322 are formed using different 2D materials. In some embodiments, first monolayer 1206 and third monolayer 1322 can be attached to each other using van der Waals bonding. In some embodiments, an external force 1314 can be used to improve bonding uniformity at interfaces. For example, force 1314 can be similar to force 314. In some embodiments, a surface area of first monolayer 1206 can be greater than a surface area of second monolayer 1210, and the bonding process can include physically bonding perimeter regions of first monolayer 1206 and carrier film 1212 to protect enclosed second monolayer 1210. The interface between first and second monolayer layers 1206 and 1210 as well as the interface between first monolayer 1206 and third monolayer 1322 can be substantially free of residue since these interfaces are enclosed and not exposed to contaminants during the transfer process. A heterostack 1401 includes first, second, and third monolayers 1206, 1210, and 1322 that are held together by van der Waals bonding processes as described above in FIGS. 12 and 13.

Figure 14:
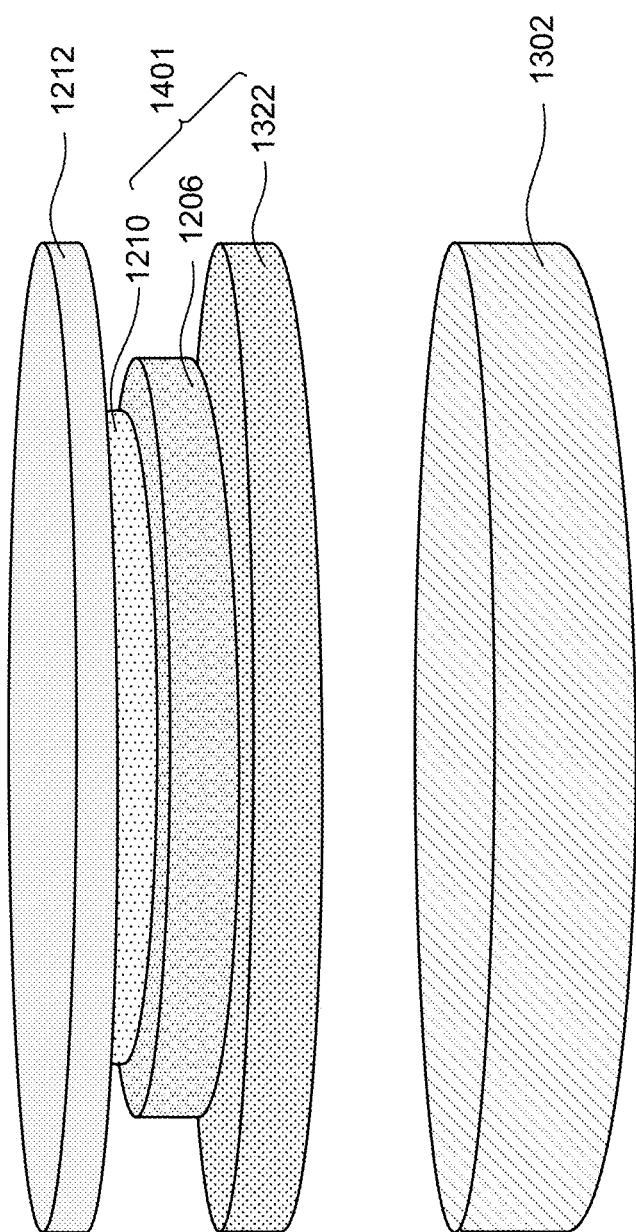

Referring to FIG. 11, in operation 1108, the third monolayer is separated from the substrate, according to some embodiments. As shown in FIG. 14, third monolayer 1322 can be separated from substrate 1302. Third monolayer 1322 can be separated from substrate 1302 by pulling carrier film 1212 in a direction away from substrate 1302. In some embodiments, separating third monolayer 1322 from substrate 1302 can be similar to the process of separating first monolayer 1202 from substrate 1202 and is not described in detail here for simplicity.

Figure 15:
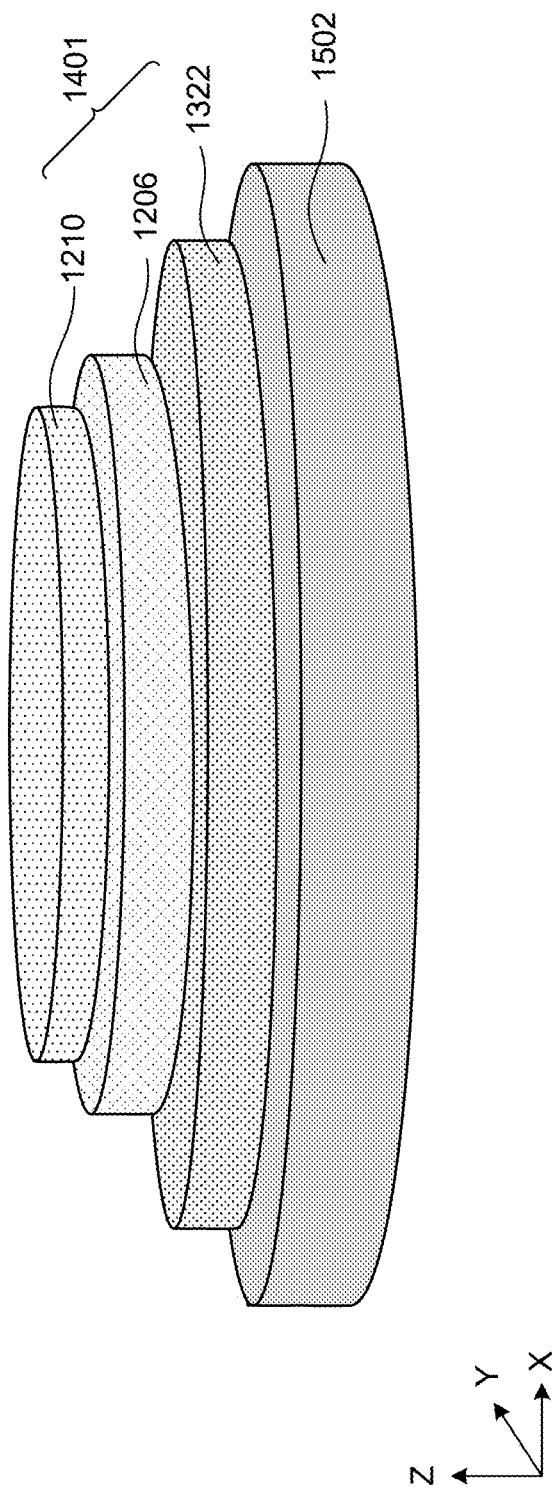

Referring to FIG. 11, in operation 1110, the third monolayer is attached to a substrate and the carrier film is removed, according to some embodiments. As shown in FIG. 15, third monolayer 1322 of heterostack 1401 can be attached to a top surface of substrate 1502. In some embodiments, substrate 1502 can be similar to substrate 202 described in FIG. 2. In some embodiments, substrate 1502 can include one or more additional layers and suitable semiconductor devices, which are not illustrated in FIG. 15 for simplicity. For example, substrate 1502 can include one or more non-active devices and logic devices embedded therein. In some embodiments, substrate 1502 can be a 4-inch wafer formed using silicon or silicon oxide. Carrier film 1212 can be removed after heterostack 1401 is transferred onto a top surface of substrate 1502. Carrier film 1212 can be removed using dry plasma etching, wet chemical etching, ashing process, any suitable removal process, and combinations thereof.

Figure 16:
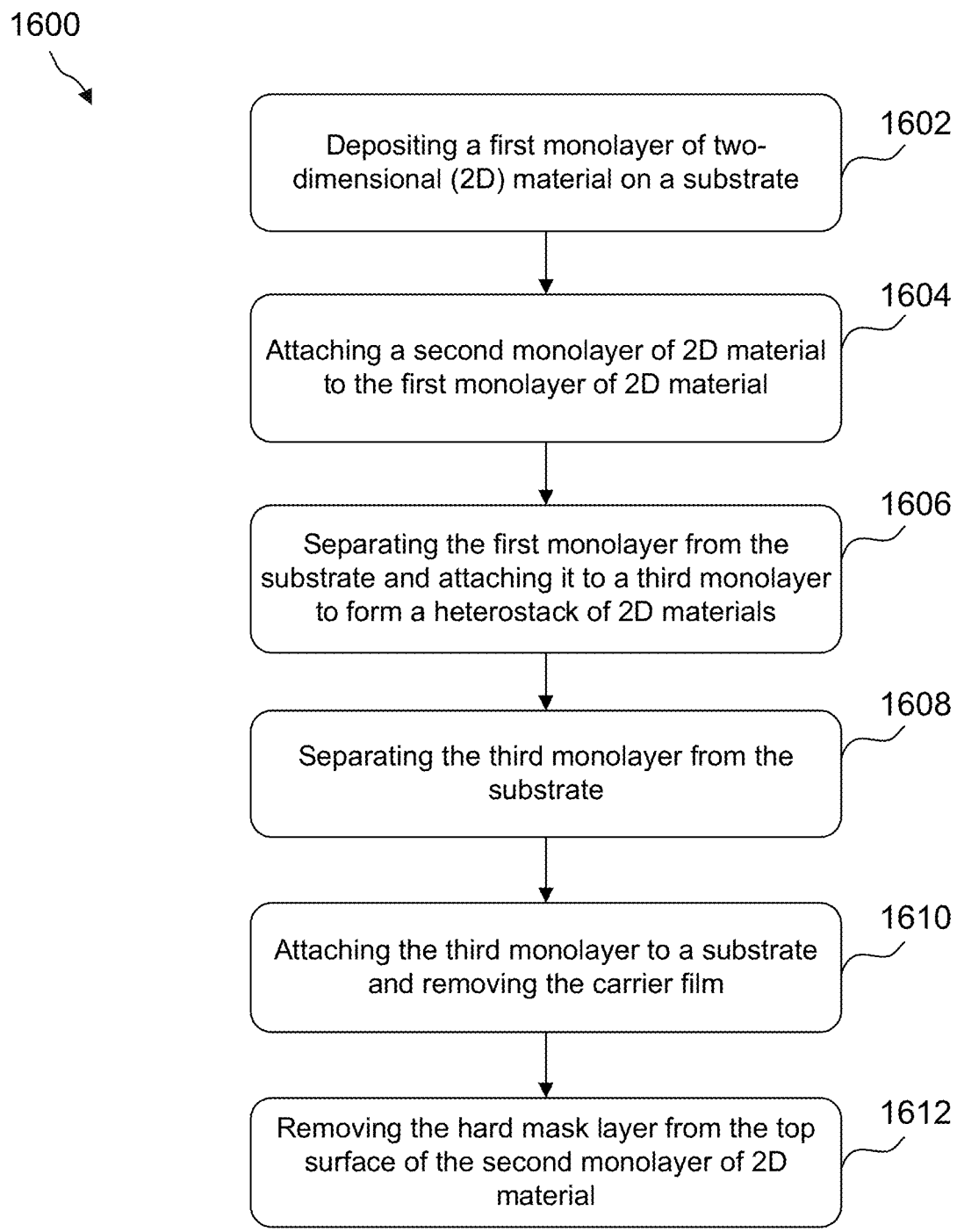
FIG. 16 is a flow diagram of a method for transferring 2D material layers, in accordance with some embodiments.

FIG. 16 is a flow diagram of a method 1600 for forming a heterostack including 2D materials, according to some embodiments. For illustrative purposes, the operations illustrated in FIG. 16 will be described with reference to the example fabrication process as illustrated in FIGS. 17-21. Operations can be performed in a different order or not performed depending on specific applications. It should be noted that method 1600 may not produce a complete semiconductor device. Accordingly, it is understood that additional processes can be provided before, during, and after method 1600, and that some other processes may only be briefly described herein. Similar elements in FIGS. 17-21 and FIGS. 2-5 are labelled with the same annotations for simplicity. The transfer process described in FIGS. 17-21 can be performed in a processing chamber under vacuum without exposing the structures to an ambient environment, which can provide the benefit of preventing surface oxidation and contaminants adsorption that in turn increases the magnitude of van der Waals force at the interface. In some embodiments, the vacuum can be maintained between about $1\times10^{-3}$ Torr and about $1\times10^{-5}$ Torr.

Figure 17:
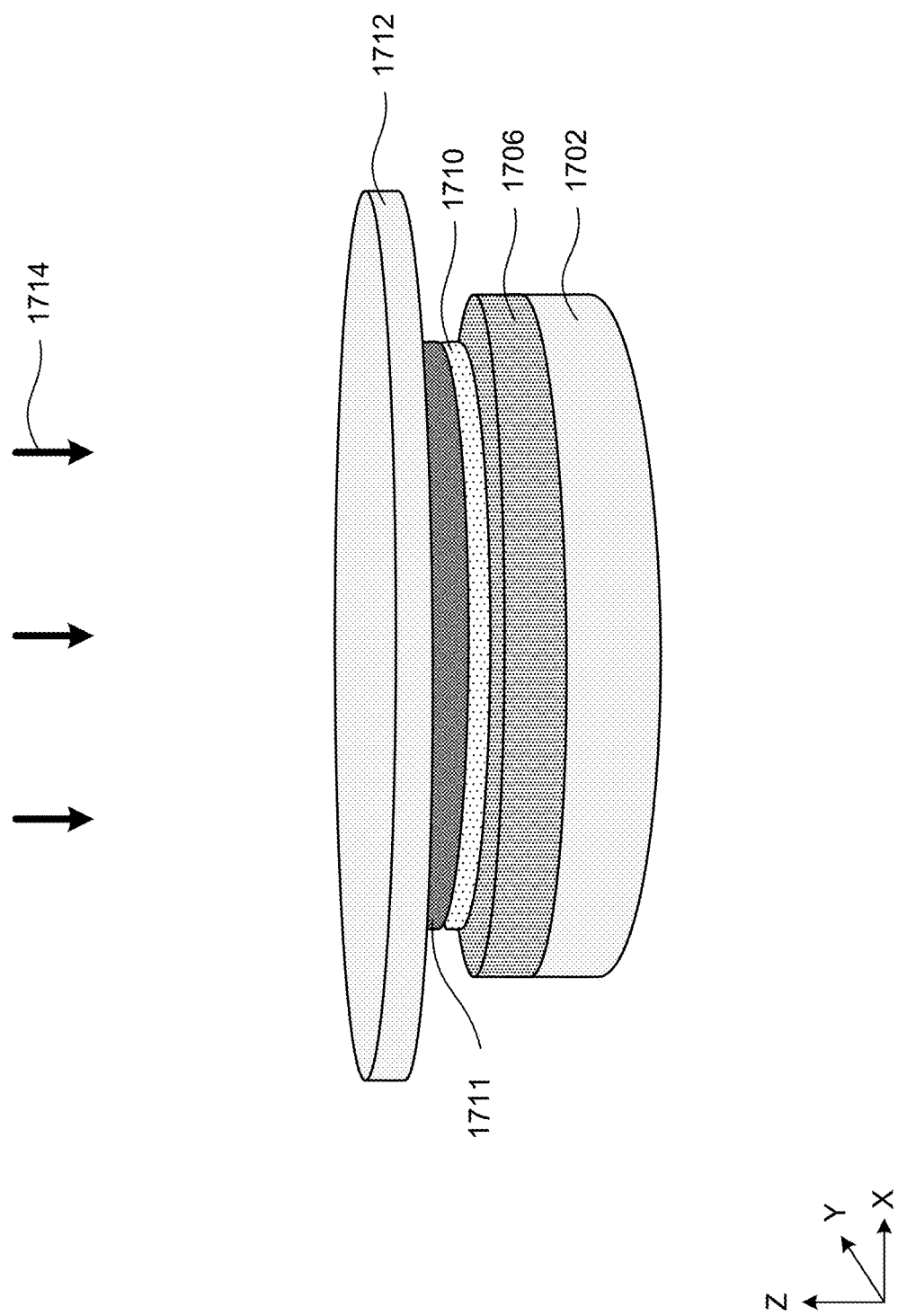
FIGS. 17-21 illustrate various views of layers of 2D materials at various stages of their fabrication process, in accordance with some embodiments.
Figure 18:
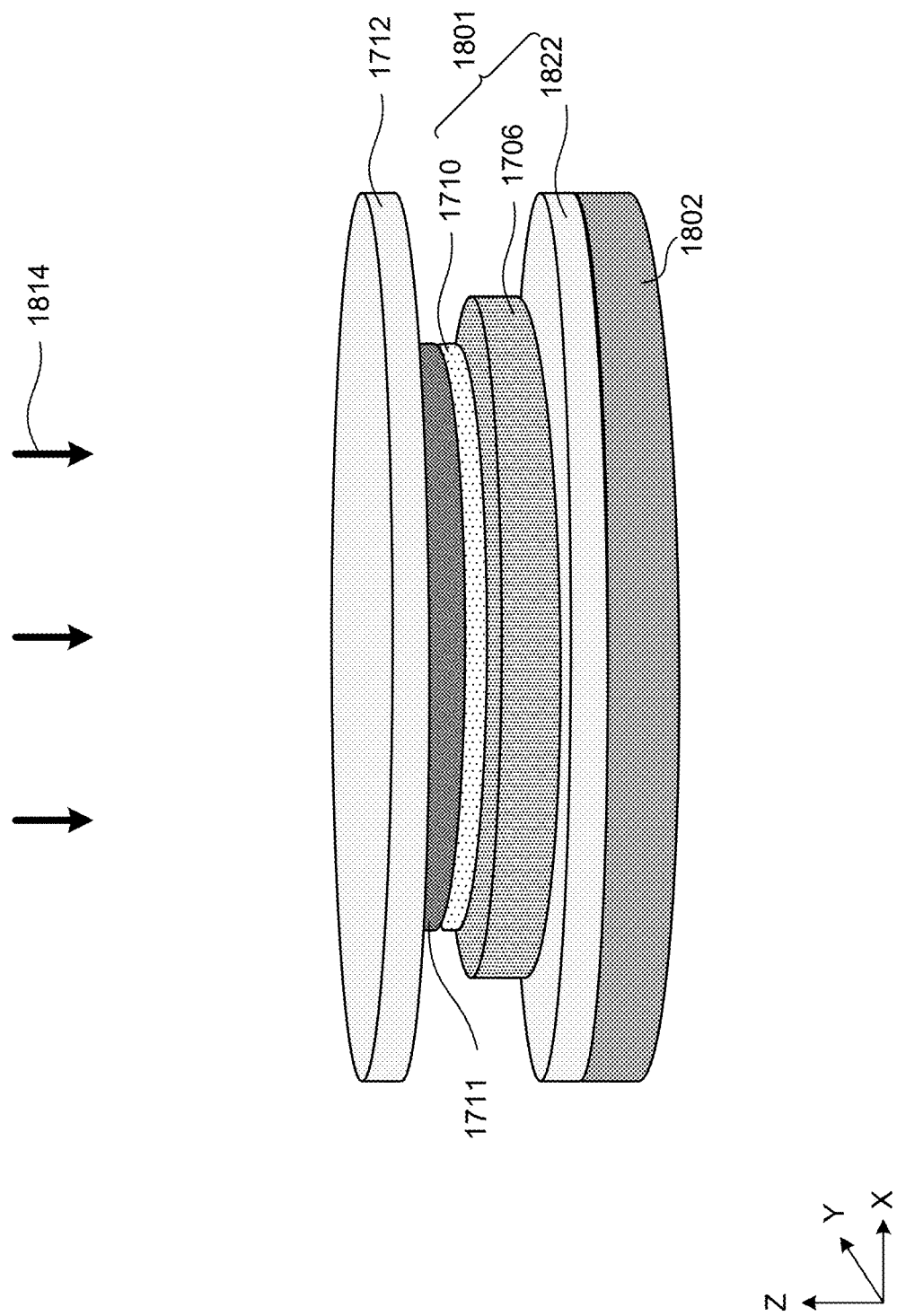

Referring to FIG. 16, in operation 1602, a first monolayer of 2D material can be deposited on a substrate, according to some embodiments. As shown in FIG. 17, first monolayer 1706 can be deposited on substrate 1702. In some embodiments, first monolayer 1706 can be formed using TMDs. Suitable TMDs can be denoted as $MX_2$, where M denotes a transition metal element and X denotes a chalcogen element. For example, the transition metal element can be molybdenum or tungsten. In some embodiments, the chalcogen element can be one of sulfur, selenium, or tellurium. In some embodiments, other suitable TMD materials can be used. First monolayer 1706 can be deposited using ALD, LPCVD, ALCVD, UHVCVD, RPCVD, MBE, any suitable epitaxial process, and combinations thereof. In some embodiments, first monolayer 1706 can be similar to first monolayer 1206 described in FIG. 12. In some embodiments, substrate 1702 can be similar to substrate 202 described in FIG. 2 and is not described in detail here for simplicity.

Referring to FIG. 16, in operation 1604, a second monolayer of 2D material is attached to the first monolayer of 2D material, according to some embodiments. A bottom surface of a second monolayer 1710 can be attached to a top surface of first monolayer 1706. First and second monolayers 1706 and 1710 can be attached together by van der Waals bonding to form a heterostack. In some embodiments, second monolayer 1710 can be formed using a 2D material, such as h-BN. In some embodiments, second monolayer 1710 can be formed using any suitable 2D material, such as TMD materials. In some embodiments, first and second monolayers 1706 and 1710 can be formed using different 2D materials. For example, first monolayer 1706 can be formed using molybdenum disulfide and second monolayer 1710 can be formed using h-BN. Additionally, a hard mask 1711 can be formed on a top surface of second monolayer 1710. Hard mask 1711 can be formed using a material similar to that of hard mask 711. For example, hard mask 1711 can be formed of aluminum oxide material and deposited using ALD. A carrier film 1712 can be attached to a top surface of hard mask 1711. Carrier film 1712 can be similar to carrier film 312 and formed using a polymer material, such as PMMA, PVA, PPC, PS, any suitable polymer material, and combinations thereof. In some embodiments, an external force 1714 that is similar to force 314 can be applied to improve bonding uniformity between the bonding interfaces. In some embodiments, perimeter regions of carrier film 1712 and first monolayer 1706 can be bonded together using a process similar to that of carrier film 312 and first monolayer 206 described in FIG. 3B and is not described in detail herein for simplicity.

Referring to FIG. 16, in operation 1606, the first monolayer can be separated from the substrate and attached to a third monolayer to form a heterostack of 2D materials, according to some embodiments. Separating first monolayer 1706 from substrate 1702 can be achieved by pulling carrier film 1712 in a direction away from substrate 1702. The separation process can be similar to that of separating first monolayer 1206 from substrate 1202 and is not described in detail herein for simplicity.

After first monolayer 1706 is separated from substrate 1702, first monolayer 1706 can be attached to third monolayer 1822 formed of 2D materials. In some embodiments, third monolayer 1822 can be formed using h-BN. In some embodiments, third monolayer 1822 can be formed using a suitable 2D material, such as a TMD layer. In some embodiments, first and third monolayers 1706 and 1822 are formed using different 2D materials. In some embodiments, first monolayer 1706 and third monolayer 1822 can be attached to each other using van der Waals bonding. In some embodiments, an external force 1814 can be used to improve bonding uniformity at interfaces. For example, force 1814 can be similar to force 314.

In some embodiments, a surface area of first monolayer 1706 can be greater than a surface area of second monolayer 1710, and the bonding process can include physically bonding perimeter regions of first monolayer 1706 and carrier film 1712 to protect enclosed second monolayer 1710. The interface between first and second monolayer layers 1706 and 1710, as well as the interface between first monolayer 1706 and third monolayer 1822, can be substantially free of residue since these interfaces are enclosed and not exposed to contaminants during the transfer process. A heterostack 1801 can include first, second, and third monolayers 1806, 1810, and 1822 that are held together by van der Waals bonding processes as described in FIGS. 17 and 18.

Figure 19:
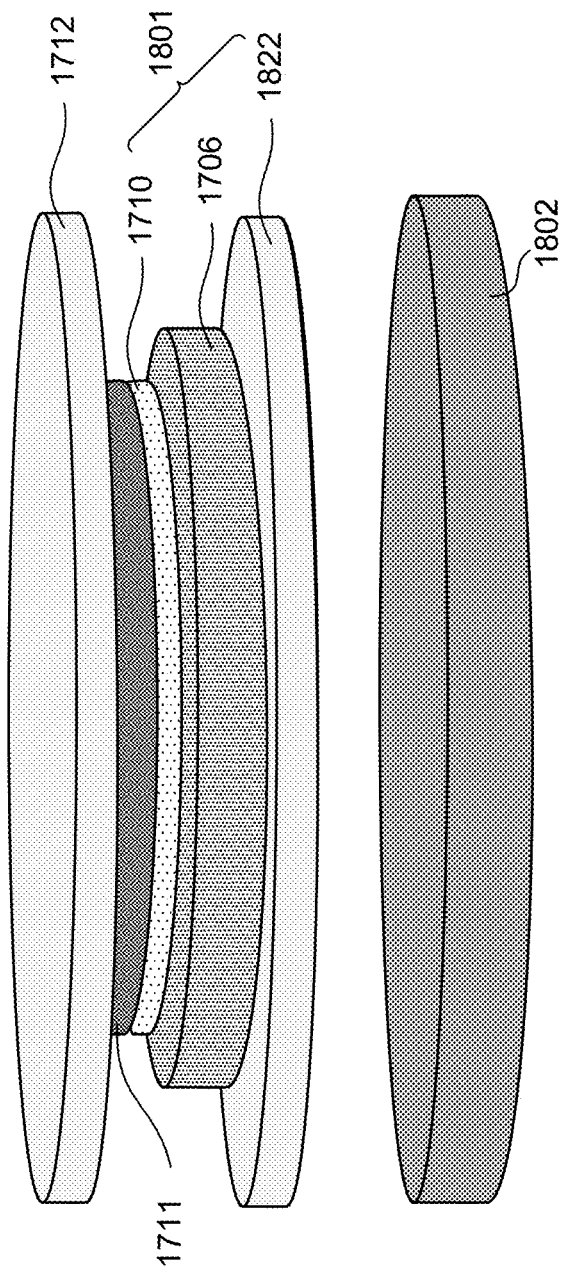

Referring to FIG. 16, in operation 1608, the third monolayer is separated from the substrate, according to some embodiments. As shown in FIG. 19, third monolayer 1822 can be separated from substrate 1802. Third monolayer 1822 can be separated from substrate 1802 by pulling carrier film 1712 in a direction away from substrate 1802. The separation process can be similar to the separation process described in FIGS. 12 and 14 and is not described in detail herein for simplicity.

Figure 20:
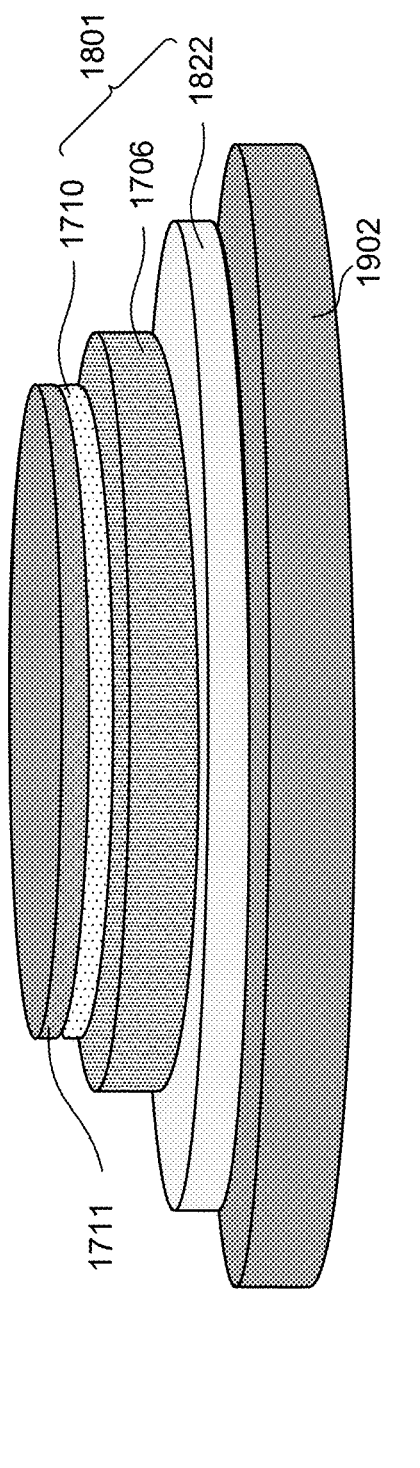

Referring to FIG. 16, in operation 1610, the third monolayer is attached to a substrate and the carrier film is removed, according to some embodiments. As shown in FIG. 20, third monolayer 1822 of heterostack 1801 can be attached to a top surface of substrate 1902. In some embodiments, substrate 1902 can be similar to substrate 202 described in FIG. 2. In some embodiments, substrate 1902 can include one or more additional layers and suitable semiconductor devices and are not illustrated in FIG. 20 for simplicity. Carrier film 1712 can be removed after heterostack 1801 is transferred onto a top surface of substrate 1902. Carrier film 1712 can be removed using dry plasma etching, wet chemical etching, ashing process, any suitable removal process, and combinations thereof.

Figure 21:
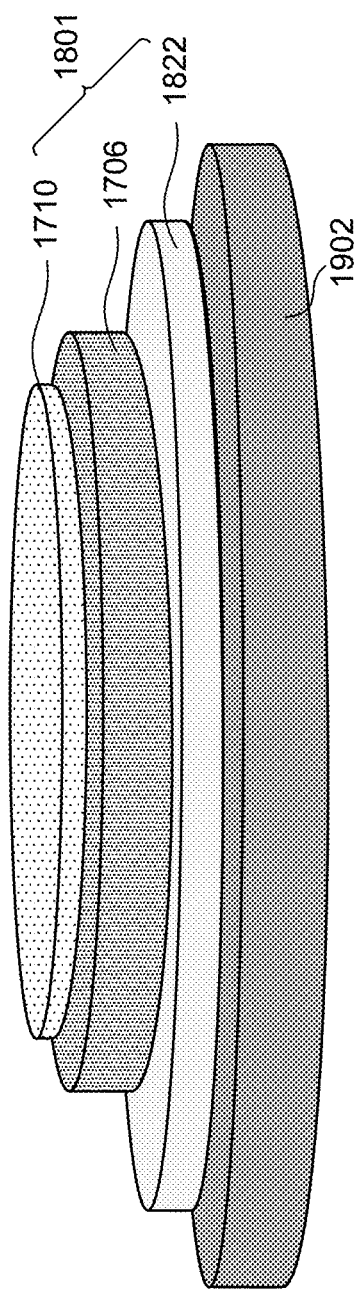

Referring to FIG. 16, in operation 1612, the hard mask layer is removed from the top surface of the second monolayer, according to some embodiments. As shown in FIG. 21, hard mask 1711 can be removed to expose the underlying second monolayer 1810. Hard mask 1711 can be removed using dry plasma etching, wet chemical etching, any suitable etching processes, and combinations thereof. The removal process of hard mask 1711 can be similar to the removal process described in FIG. 10 and is not described in detail herein for simplicity.

Figure 22A:
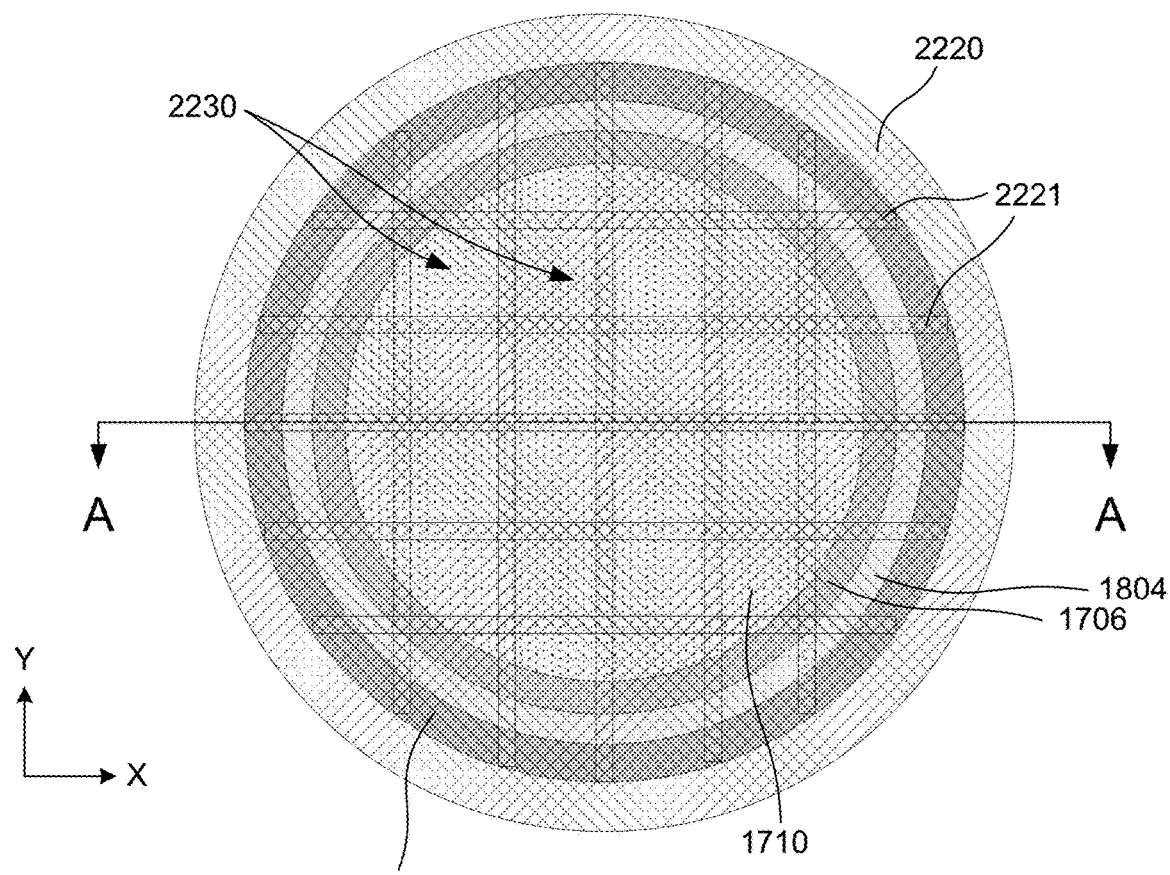
FIGS. 22A and 22B illustrate a heterostack of 2D materials during a transfer process, in accordance with some embodiments.
Figure 22B:
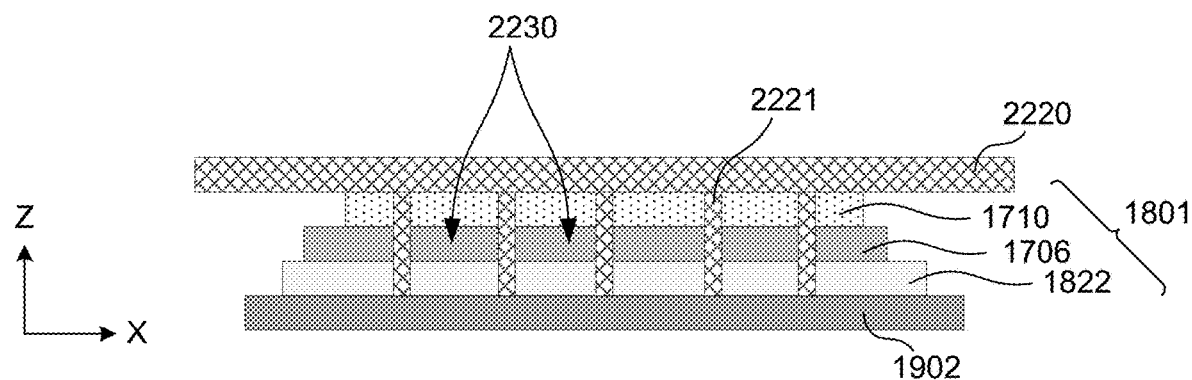
Figure 23:
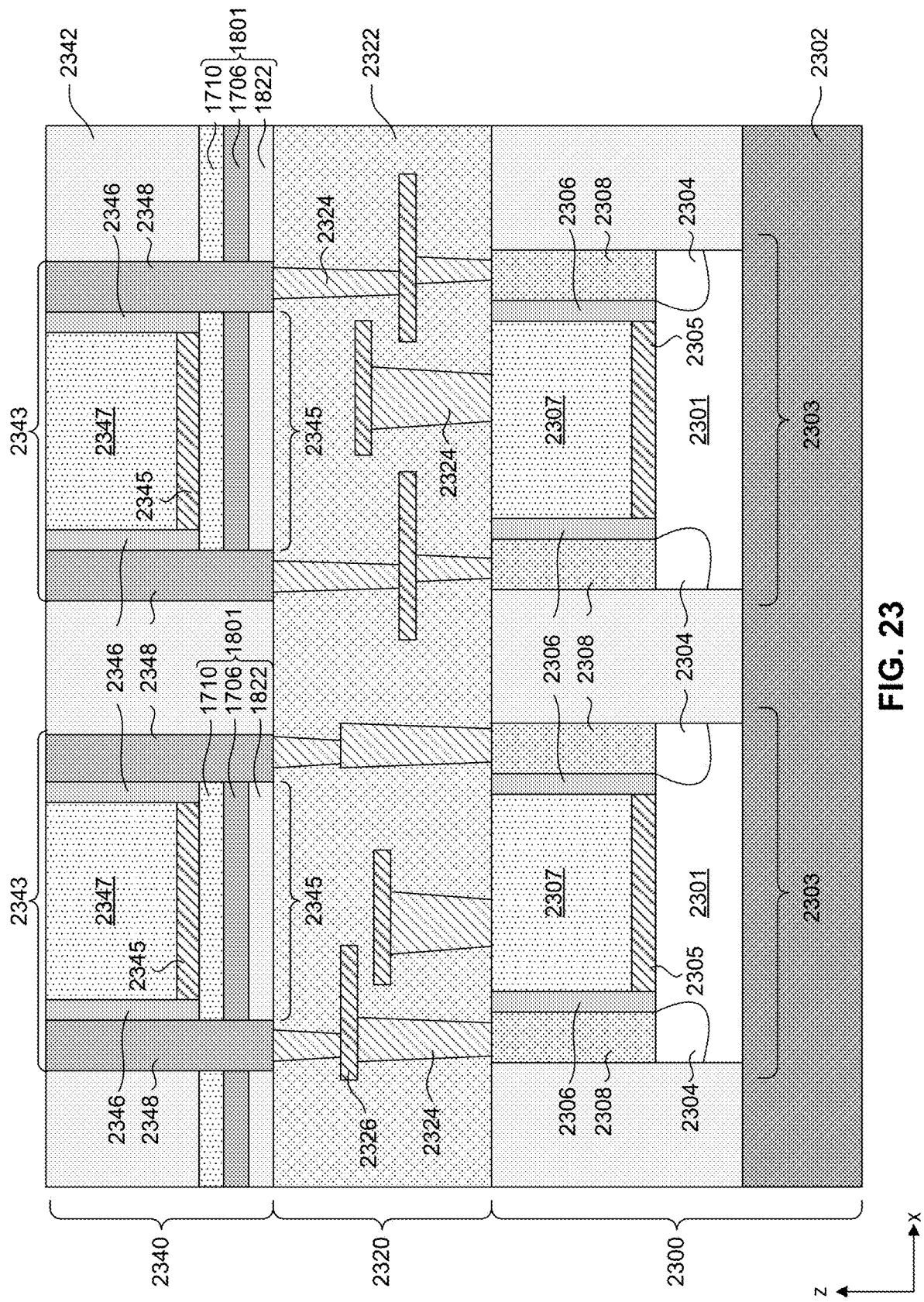
FIG. 23 illustrates a three-dimensional (3D) monolithic semiconductor device, in accordance with some embodiments.

FIGS. 22A, 22B, and 23 described exemplary additional fabrication processes after the heterostack has been formed as described in FIGS. 1-21. FIGS. 22A and 22B are respective plan and cross-sectional views of a carrier film 2220 formed on heterostack 1801 and substrate 1902 of FIG. 21. The cross-sectional view illustrated in FIG. 22B is viewed from plane A-A' of FIG. 22A. Other suitable structures can be formed and are not illustrated in FIGS. 22A and 22B for simplicity. Carrier film 2220 can be used to transfer heterostack 1801 to other substrates for further processing.

As shown in FIGS. 22A and 22B, carrier film 2220 can be formed on the top surface of heterostack 1801. For example, carrier film 2220 can be formed on the top surface of second monolayer 1710. In addition, carrier film 2220 can also be deposited into heterostack 1801. For example, a carrier film grid 2221 can extend vertically (e.g., z direction) through first, second, and third monolayers 1706, 1710, and 1822. The term "vertical," as used herein, means nominally perpendicular to the surface of a substrate. Carrier film grid 2221 can be formed by etching a plurality of trenches in heterostack 1801 and depositing a carrier film material in the trenches until the trenches are completely filled. In some embodiments, carrier film grid 2221 and carrier film 2220 can be formed using the same material, such as a polymer material. The deposition of carrier film material can continue until carrier film 2220 is formed on the top surface of second monolayer 1710. Implementing carrier film grid 2221 can improve the structural integrity of the heterostack 1801 during a transfer process. Carrier film 2220 and carrier film grid 2221 can be formed using materials and processes similar to those of carrier film 312 and are not described in detail herein for simplicity. As shown in FIGS. 22A and 22B, carrier film grid 2221 can divide heterostack 1801 into an array of dies 2230, with each die including a heterostack of 2D materials. In some embodiments, the boundary of each die of the array of dies 2230 can also align with semiconductor dies onto which the heterostack 1801 will be transferred. In some embodiments, carrier film grid 2221 can also be implemented in heterostacks 501, 701, and 1401 respectively described in FIGS. 5, 7, and 14.

FIG. 23 illustrates a three-dimensional (3D) monolithic semiconductor structure incorporating semiconductor devices having heterostacks of 2D materials, according to some embodiments. The heterostack of 2D materials can be transferred onto existing semiconductor devices using one or more of the transfer processes described above in FIGS. 1-22B. Additional structures can be included in the structure illustrated in FIGS. 23 and are not illustrated for simplicity.

The 3D monolithic semiconductor structure illustrated in FIG. 23 can include a plurality of front-end-of-line (FEOL) structures 2300 and a plurality of back-end-of-line (BEOL) structures 2320. Heterostack 1801 of FIGS. 21, 22A, and 22B can be transferred onto top surfaces of BEOL structures 2320 using carrier film 2220 and carrier film grid 2221 described in FIGS. 22A and 22B. After the transfer process, carrier film 2220 and carrier film grid 2221 can be removed by suitable etching processes.

FEOL structures 2300 can include a plurality of transistors, such as transistors 2303 formed over a substrate 2302. Substrate 2302 can be similar to substrate 202 described in FIG. 2 and is not described in detail herein for simplicity. Transistors 2303 can include various types of transistor devices, such as a pair of n-type and p-type metal-oxide-semiconductor (MOS) transistors. Transistors 2303 can include substrate 2301, a pair of source/drain region 2304, gate dielectric layer 2305, spacers 2306, gate electrode 2307, and source/drain contacts 2308. Source/drain regions refer to the source and/or drain junctions that form two terminals of a FET. Additional structures can be formed in transistors 2303 and are not illustrated in FIG. 23 for simplicity.

BEOL structures 2320 can include a plurality of interconnect structures formed in an interlayer dielectric (ILD) layer. For example, vias 2324 formed in ILD layer 2322 can be electrically and physically connected to source/drain contacts 2308 of FEOL structures 2300. Conductive lines 2326 formed in ILD layer 2322 can be connected to one or more vias 2324 to provide lateral (e.g., x direction) electrical connection. Vias 2324 can also be connected to other structures formed over BEOL structures 2320. In some embodiments, vias 2324 and conductive lines 2326 can be formed using copper, cobalt, aluminum, any suitable conductive materials, and combinations thereof.

Semiconductor structures 2340 can be formed on BEOL structures 2320. Semiconductor structures 2340 can include transistors 2343 that incorporate heterostacks of 2D materials. For example, heterostacks 1801 of FIGS. 22A and 22B can be transferred and placed on a top surface of ILD layer 2322 of BEOL structures 2320. Heterostacks formed of multiple layers of 2D materials can be used as channel regions 2345 to improve the device performance of transistors 2343. Portions of heterostacks 1801 can be used as channel regions for transistors 2343. Although heterostack 1801 is illustrated in FIG. 23, other heterostacks can also be implemented in transistors 2343. For example, heterostacks 501, 701, and 1401 respectively described in FIGS. 5, 7, and 14 can also be implemented in transistors 2343. Additional layers of 2D materials can be added using the wafer-scale transferring processes described in the present disclosure until nominal thickness or electrical properties of the heterostack has been achieved. As shown in FIG. 23, transistor devices 2343 can include a channel region 2345 formed between source/drain regions 2348. Source/drain regions 2348 can be formed using a conductive material, such as copper and doped silicon. In some embodiments, channel regions 2345 can be formed using dies 2230 formed in heterostack 1810 by carrier film grid 2221 described in FIGS. 22A and 22B. Transistor devices 2343 can also include gate dielectric layers 2345, spacers 2346, and gate electrode 2347. Additional structures can also be included in transistor devices 2343 and are not illustrated for simplicity. For example, one or more work function layers can be formed between gate dielectric layer 2345 and gate electrode 2347. Source/drain regions 2348 of transistors 2343 can be electrically connected to source/drain contacts 2308 of transistors 2303 through the interconnect structures formed in BEOL structures 2320. Source/drain regions 2348 can be formed by etching openings through ILD layer 2342 and heterostack 1801 and depositing conductive material in the openings. In some embodiments, the conductive material can include copper.

Various embodiments in the present disclosure describe methods for forming semiconductor devices incorporating substantially residue-free 2D materials. Layers of 2D material can be stacked together via van der Waals force and transferred onto a substrate. A monolayer of 2D material is attached to another monolayer of 2D material via van der Waals force to form a van der Waals heterostack. Additional monolayers of 2D materials can be added to the heterostack by performing additional attaching and wafer-scale transferring processes. The stack can be attached to a carrier layer (e.g., a polymer film) and transferred to other substrates or devices for further processing. Using van der Waals force to form a heterostack of 2D materials can provide the benefit of, among other things, substantially residue-free surfaces and intact layers after transfer. In addition, adhesives is not needed for bonding the layers of 2D materials together during the wafer-scale transferring process.

In some embodiments, a method includes forming a first two-dimensional (2D) layer on a first substrate and attaching a second 2D layer to a carrier film. The method also includes bonding the second 2D layer to the first 2D layer to form a heterostack including the first and second 2D layers. The method further includes separating the first 2D layer of the heterostack from the first substrate and attaching the heterostack to a second substrate. The method further includes removing the carrier film from the second 2D layer.

In some embodiments, a method includes forming a first two-dimensional (2D) layer on a metal layer and depositing a hard mask layer on a second 2D layer. The method also includes attaching a carrier film to the hard mask layer and bonding the second 2D layer to the first 2D layer to form a heterostack including the first and second 2D layers. The method also includes separating the first 2D layer of the heterostack from the metal layer and attaching the heterostack to a second substrate. The method further includes removing the carrier film and the hard mask layer from the second 2D layer.

In some embodiments, a method includes forming a first two-dimensional (2D) layer on a substrate and bonding a second 2D layer to the first 2D layer. The method further includes separating the first 2D layer from the substrate and bonding the first 2D layer to a third 2D layer to form a heterostack including the first, second, and third 2D layers. The method also includes forming a transistor that includes forming first and second source/drain regions in the heterostack; forming a channel region using a portion of the heterostack between the first and second source/drain regions; and forming a gate electrode over the channel region.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first two-dimensional (2D) layer on a substrate;
   attaching a second 2D layer to a carrier film, wherein the second 2D layer comprises a 2D material different from the first 2D layer;
   bonding the second 2D layer to the first 2D layer;
   separating the first and second 2D layers from the substrate; and
   bonding the first and second 2D layers to a third 2D layer to form a heterostack, wherein the first 2D layer is in direct contact with the third 2D layer.

2. The method of claim 1, wherein bonding the second 2D layer to the first 2D layer comprises attaching, under a vacuum, the second 2D layer to the first 2D layer through van der Waals bonding.

3. The method of claim 1, wherein forming the first 2D layer comprises growing a transition metal dichalcogenide (TMD) material.

4. The method of claim 3, wherein the TMD material comprises MX2, and wherein M comprises a transition metal element and X comprises a chalcogen element.

5. The method of claim 1, further comprising forming the second 2D layer with a hexagonal boron nitride (h-BN) material.

6. The method of claim 1, wherein the carrier film comprises a polymer film.

7. The method of claim 1, further comprising removing the carrier film from the second 2D layer.

8. The method of claim 1, further comprising bonding a perimeter portion of the carrier film and a perimeter portion of the first 2D layer, wherein the second 2D layer is sealed between the carrier film and the first 2D layer.

9. The method of claim 8, further comprising applying a force to a top surface of the carrier film to deform the perimeter portion of the carrier film and the perimeter portion of the first 2D layer.

10. A method, comprising:
    forming a first two-dimensional (2D) layer on a first substrate;
    attaching a hard mask layer to a second 2D layer, wherein the hard mask layer is attached to a carrier layer and in direct contact with the second 2D layer and the carrier layer;
    bonding the second 2D layer to the first 2D layer;
    separating the first and second 2D layers from the first substrate; and
    attaching the first and second 2D layers to a third 2D layer on a second substrate to form a heterostack comprising the first, second, and third 2D layers.

11. The method of claim 10, further comprising bonding a perimeter portion of the carrier layer and a perimeter portion of the first 2D layer, wherein the second 2D layer and the hard mask layer are sealed between the carrier layer and the first 2D layer.

12. The method of claim 10, further comprising:
    separating the third 2D layer from the second substrate; and
    attaching the heterostack to a third substrate.

13. The method of claim 10, further comprising:
    removing the carrier layer; and
    removing the hard mask layer.

14. The method of claim 10, further comprising forming a transistor using the heterostack.

15. The method of claim 14, wherein forming the transistor using the heterostack comprises:
    forming first and second source/drain regions of the transistor extending through the heterostack;
    forming a channel region of the transistor using a portion of the heterostack between the first and second source/drain regions; and
    forming a gate electrode over the channel region.

16. A semiconductor device, comprising:
    a heterostack on a substrate, wherein the heterostack comprises first, second, and third two dimensional (2D) layers;
    an interlayer dielectric layer on a top surface of the heterostack;
    first and second source/drain regions extending completely through the heterostack and the interlayer dielectric layer, wherein the first and second source/drain regions are in contact with the heterostack;
    a channel region using a portion of the heterostack between the first and second source/drain regions;
    a gate electrode over the channel region and on a first side of the heterostack; and
    first and second interconnect structures on a second side of the heterostack, wherein:
       top surfaces of the first and second interconnect structures are in contact with bottom surfaces of the first and second source/drain regions on the second side of the heterostack, respectively,
       the second side is opposite to the first side, and
       the first and second interconnect structures connect the first and second source/drain regions to one or more transistors.

17. The semiconductor device of claim 16, wherein the first and third 2D layers comprise a first 2D material and the second 2D layer comprises a second 2D material different from the first 2D material.

18. The semiconductor device of claim 16, wherein the first and third 2D layers comprise a hexagonal boron nitride (h-BN) material and the second 2D layer comprises a transition metal dichalcogenide (TMD) material.

19. The semiconductor device of claim 18, wherein the TMD material comprises MX2, and wherein M comprises a transition metal element and X comprises a chalcogen element.

20. The semiconductor device of claim 16, wherein the first and second source/drain regions are connected to source/drain regions of the one or more transistors through the first and second interconnect structures, and wherein top surfaces of the interlayer dielectric layer, the first and second source/drain regions, and the gate electrode are coplanar.

* * * * *